US012276910B2

(12) United States Patent
Aqad et al.

(10) Patent No.: US 12,276,910 B2
(45) Date of Patent: Apr. 15, 2025

(54) PHOTORESIST COMPOSITIONS AND PATTERN FORMATION METHODS

(71) Applicant: ROHM AND HAAS ELECTRONIC MATERIALS LLC, Marlborough, MA (US)

(72) Inventors: Emad Aqad, Northborough, MA (US); Brandon Wenning, San Diego, CA (US); Choong-Bong Lee, Westborough, MA (US); James W. Thackeray, Braintree, MA (US); Ke Yang, Westborough, MA (US); James F. Cameron, Brookline, MA (US)

(73) Assignee: DUPONT ELECTRONIC MATERIALS INTERNATIONAL, LLC, Marlborough, MA (US)

( * ) Notice: Subject to any disclaimer, the term of this patent is extended or adjusted under 35 U.S.C. 154(b) by 204 days.

(21) Appl. No.: 17/339,522

(22) Filed: Jun. 4, 2021

(65) Prior Publication Data

US 2022/0019143 A1    Jan. 20, 2022

Related U.S. Application Data

(60) Provisional application No. 63/052,172, filed on Jul. 15, 2020.

(51) Int. Cl.
| | | |
|---|---|---|
| G03F 7/039 | (2006.01) | |
| C08F 212/14 | (2006.01) | |
| C08F 220/18 | (2006.01) | |
| C08F 220/28 | (2006.01) | |
| G03F 7/004 | (2006.01) | |
| G03F 7/038 | (2006.01) | |

(52) U.S. Cl.
CPC ............ *G03F 7/039* (2013.01); *C08F 212/24* (2020.02); *C08F 220/1807* (2020.02); *C08F 220/1809* (2020.02); *C08F 220/283* (2020.02); *G03F 7/0045* (2013.01); *G03F 7/038* (2013.01)

(58) Field of Classification Search
CPC .................................................... G03F 7/0045
See application file for complete search history.

(56) References Cited

U.S. PATENT DOCUMENTS

| | | |
|---|---|---|
| 4,189,323 A | 2/1980 | Buhr |
| 5,110,709 A | 5/1992 | Aoai et al. |
| 5,443,690 A | 8/1995 | Takechi et al. |
| 5,688,628 A | 11/1997 | Oie et al. |
| 7,968,268 B2 | 6/2011 | Wang |
| 8,431,325 B2 | 4/2013 | Hashimoto et al. |
| 8,574,813 B2 | 11/2013 | Irie |
| 8,945,814 B2 | 2/2015 | Cameron et al. |
| 10,042,251 B2 | 8/2018 | LeBeaume et al. |
| 2003/0099900 A1 | 5/2003 | Yamada et al. |
| 2003/0232274 A1 | 12/2003 | Barclay et al. |
| 2009/0269696 A1 | 10/2009 | Ohsawa et al. |
| 2010/0129738 A1 | 5/2010 | Takemura et al. |
| 2015/0125794 A1* | 5/2015 | Hatakeyama ......... G03F 7/2041 430/296 |
| 2015/0177615 A1 | 6/2015 | Jain et al. |
| 2016/0147147 A1* | 5/2016 | Hirano .................. G03F 7/0046 430/311 |
| 2017/0248844 A1 | 8/2017 | Aqad et al. |
| 2018/0362752 A1 | 12/2018 | Aquad et al. |
| 2019/0243244 A1 | 8/2019 | Kaneko et al. |
| 2020/0183274 A1* | 6/2020 | Tango ....................... G03F 7/32 |

FOREIGN PATENT DOCUMENTS

| | | | |
|---|---|---|---|
| JP | 2008203452 A | | 9/2008 |
| JP | 2008241870 A | * | 10/2008 |
| JP | 2009263487 A | | 11/2009 |
| JP | 2017161717 A | | 9/2017 |
| JP | 2020016796 A | | 1/2020 |
| WO | 2011111807 A1 | | 9/2011 |
| WO | 2018023033 A1 | | 2/2018 |
| WO | 2020138236 A1 | | 7/2020 |

OTHER PUBLICATIONS

English Machine Translation of JP 2008241870 A (Year: 2008).*

* cited by examiner

*Primary Examiner* — Mark F. Huff
*Assistant Examiner* — Nicholas E Brown
(74) *Attorney, Agent, or Firm* — CANTOR COLBURN LLP

(57) ABSTRACT

A photoresist composition comprising: a first polymer comprising a first repeating unit comprising a hydroxy-aryl group and a second repeating unit comprising an acid-labile group; a second polymer comprising a first repeating unit comprising an acid-labile group, a second repeating unit comprising a lactone group, and a third repeating unit comprising a base-soluble group, wherein the base-soluble group has a pKa of less than or equal to 12, and wherein the base-soluble group does not comprise a hydroxy-substituted aryl group; a photoacid generator; and a solvent, wherein the first polymer and the second polymer are different from each other.

18 Claims, No Drawings

PHOTORESIST COMPOSITIONS AND PATTERN FORMATION METHODS

CROSS REFERENCE TO RELATED APPLICATIONS

This application claims priority to and the benefit of U.S. Provisional Application Ser. No. 63/052,172, filed on Jul. 15, 2020, the entire content of which is incorporated by reference herein.

FIELD

The present invention relates to photoresist compositions that contain a photoactive component and a blend of two different polymers and to pattern formation methods using such photoresist compositions. The invention finds particular applicability in lithographic applications in the semiconductor manufacturing industry.

BACKGROUND

Photoresist materials are photosensitive compositions typically used for transferring an image to one or more underlying layers such as a metal, semiconductor or dielectric layer disposed on a semiconductor substrate. To increase the integration density of semiconductor devices and allow for the formation of structures having dimensions in the nanometer range, photoresists and photolithography processing tools having high-resolution capabilities have been and continue to be developed.

Positive-tone chemically amplified photoresists are conventionally used for high-resolution processing. Such resists typically employ a polymer having acid-labile groups and a photoacid generator. Pattern-wise exposure to activating radiation through a photomask causes the acid generator to form an acid which, during post-exposure baking, causes cleavage of the acid-labile groups in exposed regions of the polymer. This creates a difference in solubility characteristics between exposed and unexposed regions of the resist in a developer solution. In a positive tone development (PTD) process, exposed regions of the photoresist layer become soluble in the developer and are removed from the substrate surface, whereas unexposed regions, which are insoluble in the developer, remain after development to form a positive image. The resulting relief image permits selective processing of the substrate. See, e.g., Uzodinma Okoroanyanwu, Chemistry and Lithography, SPIE Press and John Wiley and Sons, Inc., 2010 and Chris Mack, Fundamental Principles of Optical Lithography, John Wiley and Sons, Inc., 2007.

One approach to achieving nm-scale feature sizes in semiconductor devices is the use of short wavelengths of light, for example, 193 nanometers (nm) or less, during exposure of chemically amplified photoresists. To further improve lithographic performance, immersion lithography tools have been developed to effectively increase the numerical aperture (NA) of the lens of the imaging device, for example, a scanner having a KrF (248 nm) or ArF (193 nm) light source. This is accomplished by use of a relatively high refractive index fluid, typically water, between the last surface of the imaging device and the upper surface of the semiconductor wafer. ArF immersion tools are currently pushing the boundaries of lithography to the 16 nm and 14 nm nodes with the use of multiple (double or higher order) patterning. The use of multiple patterning, however, is generally costly in terms of increased materials usage and number of processing steps required, as compared with single step, directly imaged patterns. This has provided motivation for development of next-generation technologies, such as extreme ultraviolet (EUV) lithography and e-beam lithography. However, as lithographic resolution becomes increasingly higher, linewidth roughness (LWR) and critical dimension uniformity (CDU) of the photoresist patterns have become of increased importance in forming high-fidelity patterns.

EUV and e-beam photoresist compositions and their use have been described in the literature. For example, U.S. Patent Pub. No. 2019/0243244 discloses e-beam photoresist compositions comprising a single polymer or a blend of polymers having repeat units that contain a hydroxy group bonded to an aromatic ring. The resulting e-beam lithographic images were rough patterns with LWR values from 16 to 19 nm for a 100 nm line/space 1/1 pattern and a CDU from 6 to 9 nm for contact hole patterns with a contact hole diameter of 100 nm.

Despite the advancement in resist technology, there is still a need for photoresists compositions that address one or more problems associated with the state of the art. In particular, there is a continuing need for photoresist compositions having good sensitivity, including photoresist compositions that can achieve a lower LWR for line/space patterns and a lower CDU for contact hole patterns.

SUMMARY

Provided is a photoresist composition comprising a first polymer comprising a first repeating unit comprising a hydroxy-aryl group and a second repeating unit comprising an acid-labile group; a second polymer comprising a first repeating unit comprising an acid-labile group, a second repeating unit comprising a lactone group, and a third repeating unit comprising a base-soluble group, wherein the base-soluble group has a pKa of less than or equal to 12, and wherein the base-soluble group does not comprise a hydroxy-aryl group; a photoacid generator; and a solvent, wherein the first polymer and the second polymer are different from each other.

Also provided is a pattern formation method, comprising: (a) applying a layer of a photoresist composition as described herein on a substrate; (b) pattern-wise exposing the photoresist composition layer to activating radiation; and (c) developing the exposed photoresist composition layer to provide a resist relief image.

DETAILED DESCRIPTION

Reference will now be made in detail to exemplary embodiments, examples of which are illustrated in the present description. In this regard, the present exemplary embodiments may have different forms and should not be construed as being limited to the descriptions set forth herein. Accordingly, the exemplary embodiments are merely described below, by referring to the FIGURES, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As used herein, the terms "a," "an," and "the" do not denote a limitation of quantity and are to be construed to cover both the singular and the plural, unless otherwise indicated herein or clearly contradicted by context. "Or" means "and/or" unless clearly indicated otherwise. The modifier "about" used in connection with a quantity is inclusive of the stated value and has the meaning dictated by the context (e.g., includes the degree of error associated with measurement of the particular quantity). All ranges disclosed herein are inclusive of the endpoints, and the endpoints are independently combinable with each other. The suffix "(s)" is intended to include both the singular and the plural of the term that it modifies, thereby including at least one of that term. "Optional" or "optionally" means that the subsequently described event or circumstance can or cannot occur, and that the description includes instances where the event occurs and instances where it does not. The terms "first," "second," and the like, herein do not denote an order, quantity, or importance, but rather are used to distinguish one element from another. When an element is referred to as being "on" another element, it may be directly in contact with the other element or intervening elements may be present therebetween. In contrast, when an element is referred to as being "directly on" another element, there are no intervening elements present. It is to be understood that the described components, elements, limitations, and/or features of aspects may be combined in any suitable manner in the various aspects.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, the term "hydrocarbon group" refers to an organic compound having at least one carbon atom and at least one hydrogen atom, optionally substituted with one or more substituents where indicated; "alkyl group" refers to a straight or branched chain saturated hydrocarbon having the specified number of carbon atoms and having a valence of one; "alkylene group" refers to an alkyl group having a valence of two; "hydroxyalkyl group" refers to an alkyl group substituted with at least one hydroxyl group (—OH); "alkoxy group" refers to "alkyl-O—"; "carboxylic acid group" refers to a group having the formula "—C(=O)—OH"; "cycloalkyl group" refers to a monovalent group having one or more saturated rings in which all ring members are carbon; "cycloalkylene group" refers to a cycloalkyl group having a valence of two; "alkenyl group" refers to a straight or branched chain, monovalent hydrocarbon group having at least one carbon-carbon double bond; "alkenoxy group" refers to "alkenyl-O—"; "alkenylene group" refers to an alkenyl group having a valence of two; "cycloalkenyl group" refers to a non-aromatic cyclic divalent hydrocarbon group having at least three carbon atoms, with at least one carbon-carbon double bond; "alkynyl group" refers to a monovalent hydrocarbon group having at least one carbon-carbon triple bond; the term "aromatic group" refers to a monocyclic or polycyclic ring system that satisfies the Huckel Rule and includes carbon atoms in the ring, and optionally may include one or more heteroatoms selected from N, O, and S instead of a carbon atom in the ring; "aryl group" refers to a monovalent aromatic monocyclic or polycyclic ring system where every ring member is carbon, and may include a group with an aromatic ring fused to at least one cycloalkyl or heterocycloalkyl ring; "arylene group" refers to an aryl group having a valence of two; "alkylaryl group" refers to an aryl group that has been substituted with an alkyl group; "arylalkyl group" refers to an alkyl group that has been substituted with an aryl group; "aryloxy group" refers to "aryl-O—"; and "arylthio group" refers to "aryl-S—".

The prefix "hetero" means that the compound or group includes at least one member that is a heteroatom (e.g., 1, 2, 3, or 4 or more heteroatom(s)) instead of a carbon atom, wherein the heteroatom(s) is each independently N, O, S, Si, or P; "heteroatom-containing group" refers to a substituent group that includes at least one heteroatom; "heteroalkyl group" refers to an alkyl group having 1-4 heteroatoms instead of carbon; "heterocycloalkyl group" refers to a cycloalkyl group having 1-4 heteroatoms as ring members instead of carbon; "heterocycloalkylene group" refers to a heterocycloalkyl group having a valence of two; "heteroaryl group" refers to an aryl group having 1-4 heteroatoms as ring members instead of carbon; and "heteroarylene group" refers to an heteroaryl group having a valence of two.

The term "halogen" means a monovalent substituent that is fluorine (fluoro), chlorine (chloro), bromine (bromo), or iodine (iodo). The prefix "halo" means a group including one more of a fluoro, chloro, bromo, or iodo substituent instead of a hydrogen atom. A combination of halo groups (e.g., bromo and fluoro), or only fluoro groups may be present.

"Fluorinated" shall be understood to mean having one or more fluorine atoms incorporated into the group. For example, where a $C_{1-18}$ fluoroalkyl group is indicated, the fluoroalkyl group can include one or more fluorine atoms, for example, a single fluorine atom, two fluorine atoms (e.g., as a 1,1-difluoroethyl group), three fluorine atoms (e.g., as a 2,2,2-trifluoroethyl group), or fluorine atoms at each free valence of carbon (e.g., as a perfluorinated group such as —$CF_3$, —$C_2F_5$, —$C_3F_7$, or —$C_4F_9$). A "substituted fluoroalkyl group" shall be understood to mean a fluoroalkyl group that is further substituted by an additional substituent group.

As used herein, a "hydroxy-aryl group" and a "hydroxy-substituted aryl group" refer to an aromatic group in which hydroxy is bonded directly to an aromatic ring carbon. "Hydroxy" shall be understood to mean having one or more hydroxy groups incorporated into the group. For example, where a $C_{6-12}$ hydroxy-aryl group is indicated, the hydroxy-aryl group can include one or more hydroxy groups, for example, a single hydroxy group, two hydroxy groups, three or more hydroxy groups, and the like. A "substituted hydroxy-aryl group" shall be understood to mean a hydroxy-aryl group that is further substituted by an additional substituent group.

As used herein, an "acid-labile group" refers to a group in which a bond is cleaved by the catalytic action of an acid, optionally and typically with thermal treatment, resulting in a polar group, such as a carboxylic acid or alcohol group, being formed on the polymer, and optionally and typically with a moiety connected to the cleaved bond becoming disconnected from the polymer. Such acid is typically a photo-generated acid with bond cleavage occurring during post-exposure baking. Suitable acid-labile groups include, for example: tertiary alkyl ester groups, secondary or tertiary aryl ester groups, secondary or tertiary ester groups having a combination of alkyl and aryl groups, tertiary alkoxy groups, acetal groups, or ketal groups. Acid-labile groups are also commonly referred to in the art as "acid-cleavable groups," "acid-cleavable protecting groups" "acid-labile protecting groups," "acid-leaving groups," "acid-decomposable groups," and "acid-sensitive groups."

"Substituted" means that at least one hydrogen atom on the group is replaced with another group, provided that the designated atom's normal valence is not exceeded. When the substituent is oxo (i.e., =O), then two hydrogens on the carbon atom are replaced. Combinations of substituents or variables are permissible. Exemplary groups that may be present on a "substituted" position include, but are not limited to, nitro (—NO$_2$), cyano (—CN), hydroxy (—OH), oxo (=O), amino (—NH$_2$), mono- or di-(C$_{1-6}$)alkylamino, alkanoyl (such as a C$_{2-6}$ alkanoyl group such as acyl), formyl (—C(=O)H), carboxylic acid or an alkali metal or ammonium salt thereof; esters (including acrylates, methacrylates, and lactones) such as C$_{2-6}$ alkyl esters (—C(=O)O-alkyl or —OC(=O)-alkyl) and C$_{7-13}$ aryl esters (—C(=O)O-aryl or —OC(=O)-aryl); amido (—C(=O)NR$_2$ wherein R is hydrogen or C$_{1-6}$ alkyl), carboxamido (—CH$_2$C(=O)NR$_2$ wherein R is hydrogen or C$_{1-6}$ alkyl), halogen, thiol (—SH), C$_{1-6}$ alkylthio (—S-alkyl), thiocyano (—SCN), C$_{1-6}$ alkyl, C$_{2-6}$ alkenyl, C$_{2-6}$ alkynyl, C$_{1-6}$ haloalkyl, C$_{1-9}$ alkoxy, C$_{1-6}$ haloalkoxy, C$_{3-12}$ cycloalkyl, C$_{5-18}$ cycloalkenyl, C$_{6-12}$ aryl having at least one aromatic ring (e.g., phenyl, biphenyl, naphthyl, or the like, each ring either substituted or unsubstituted aromatic), C$_{7-19}$ arylalkyl having 1 to 3 separate or fused rings and from 6 to 18 ring carbon atoms, arylalkoxy having 1 to 3 separate or fused rings and from 6 to 18 ring carbon atoms, C$_{7-12}$ alkylaryl, C$_{4-12}$ heterocycloalkyl, C$_{3-12}$ heteroaryl, C$_{1-6}$ alkyl sulfonyl (—S(=O)$_2$-alkyl), C$_{6-12}$ arylsulfonyl (—S(=O)$_2$-aryl), or tosyl (CH$_3$C$_6$H$_4$SO$_2$—). When a group is substituted, the indicated number of carbon atoms is the total number of carbon atoms in the group, excluding those of any substituents. For example, the group —CH$_2$CH$_2$CN is a C$_2$ alkyl group substituted with a cyano group.

The present invention relates to photoresist compositions that contain a first polymer, a second polymer, a photoacid generator, a solvent, and may contain additional, optional components. The inventors have surprisingly discovered that particular photoresist compositions of the invention can achieve notably improved lithographic performance, such as better contrast, higher resolution, and reduced roughness of resolved patterns.

The first polymer comprises a first repeating unit comprising a hydroxy-aryl group and a second repeating unit comprising an acid-labile group, which can be cleaved by photo-generated acid at post-exposure bake conditions. The first repeating unit of the first polymer may be derived from a monomer of formula (1):

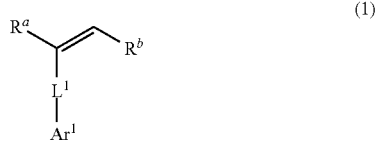

(1)

In formula (1), R$^a$ is hydrogen, halogen, cyano, substituted or unsubstituted C$_{1-10}$ alkyl, or substituted or unsubstituted C$_{1-10}$ fluoroalkyl. Preferably, R$^a$ is hydrogen, fluorine, or substituted or unsubstituted C$_{1-5}$ alkyl, typically methyl. R$^b$ is hydrogen, —C(O)— forming a ring with L$^1$, or a single bond forming a ring with Ar$^1$. Preferably, R$^b$ is hydrogen.

In formula (1), L$^1$ is a single bond or a divalent linking group comprising one or more of substituted or unsubstituted C$_{1-30}$ alkylene, substituted or unsubstituted C$_{3-30}$ cycloalkylene, substituted or unsubstituted C$_{1-30}$ heterocycloalkylene, substituted or unsubstituted C$_{6-30}$ arylene, substituted or unsubstituted C$_{7-30}$ arylalkylene, substituted or unsubstituted C$_{3-30}$ heteroarylene, or substituted or unsubstituted C$_{3-30}$ heteroarylalkylene, —O—, —C(O)—, —C(O)—O—, —C(O)—N(R$^{2a}$), —S—, —S(O)$_2$—, —N(R$^{2a}$)—S(O)$_2$—, —C$_{1-12}$ hydrocarbylene-, hydrocarbylene)-, —C(O)—O—(C$_{1-12}$ hydrocarbylene)-, or —C(O)—O—(C$_{1-12}$ hydrocarbylene)-O—, wherein R$^e$a is hydrogen, C$_{1-6}$ alkyl, or a single bond forming the ring with R$^b$; provided that R$^b$ is —C(O)— forming the ring with L$^1$ when R$^2$ is the single bond forming the ring with R$^b$. Preferably, L$^1$ is a single bond, —C(O)—O—, —C(O)—O—(C$_{1-12}$ hydrocarbylene)-, —C(O)—O—(C$_{1-12}$ hydrocarbylene)-O—, or a combination thereof.

In the case where R$^2$ is a single bond forming a ring with R$^b$ and R$^b$ is —C(O)— forming a ring with L$^1$, it is to be understood that the ring formed by R$^b$ and L$^1$ is the same as the ring formed by R$^2$ and R$^b$. For example, the structural unit comprising L$^1$, R$^a$, and R$^b$ can be of the structure:

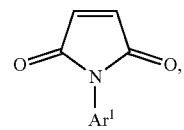

wherein Ar$^1$ is as defined in formula (1).

In formula (1), Ar$^1$ comprises a hydroxy-substituted C$_{6-60}$ aryl group, a hydroxy-substituted C$_{5-60}$ heteroaryl group, or a combination thereof, optionally further substituted with one or more of substituted or unsubstituted C$_{1-30}$ alkyl, substituted or unsubstituted C$_{1-30}$ heteroalkyl, substituted or unsubstituted C$_{3-30}$ cycloalkyl, substituted or unsubstituted C$_{1-30}$ heterocycloalkyl, substituted or unsubstituted C$_{2-30}$ alkenyl, substituted or unsubstituted C$_{2-30}$ alkynyl, substituted or unsubstituted C$_{6-30}$ aryl, substituted or unsubstituted C$_{7-30}$ arylalkyl, substituted or unsubstituted C$_{7-30}$ alkylaryl, substituted or unsubstituted C$_{3-30}$ heteroaryl, substituted or unsubstituted C$_{4-30}$ heteroarylalkyl, —OR$^{21}$, —NH$_2$, —NHR$^{22}$, or —NR$^{23}$R$^{24}$, wherein R$^{21}$ to R$^{24}$ are each independently substituted or unsubstituted C$_{1-30}$ alkyl, substituted or unsubstituted C$_{3-30}$ cycloalkyl, substituted or unsubstituted C$_{2-30}$ heterocycloalkyl, substituted or unsubstituted C$_{6-30}$ aryl, substituted or unsubstituted C$_{7-30}$ arylalkyl, substituted or unsubstituted C$_{3-30}$ heteroaryl, or substituted or unsubstituted C$_{4-30}$ heteroarylalkyl. It may be desired for Ar$^1$ to comprise a single hydroxyl group or a plurality of hydroxyl groups (e.g., Ar$^1$ may be a hydroxy-substituted C$_{6-60}$ aryl group, a hydroxy-substituted C$_{5-60}$ heteroaryl group, or a combination thereof, each of which is independently optionally further substituted with a hydroxyl group).

Non-limiting examples of monomers of formula (1) include:

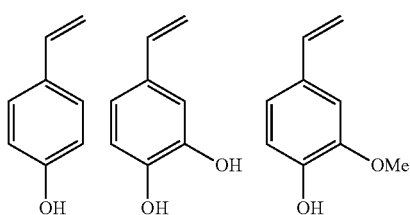

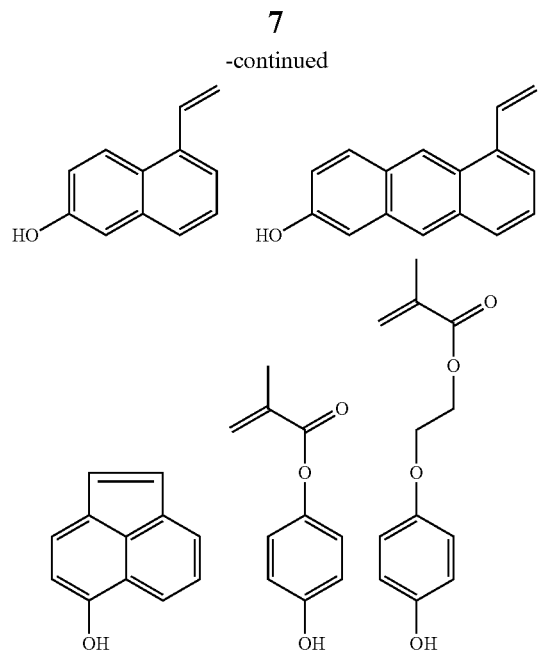
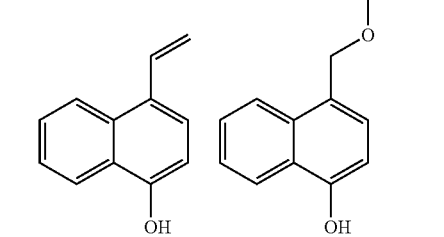
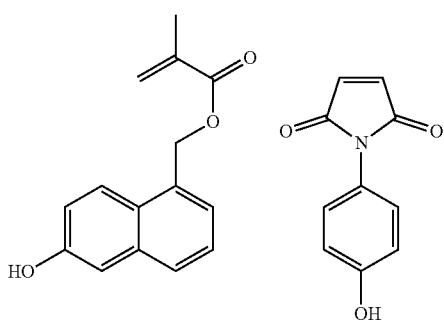
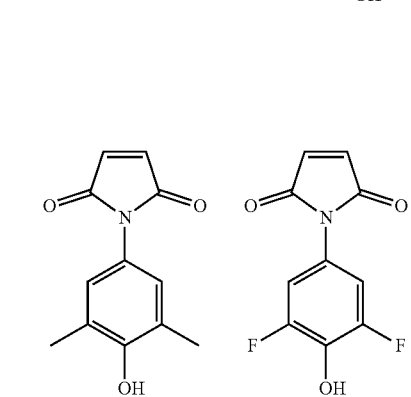
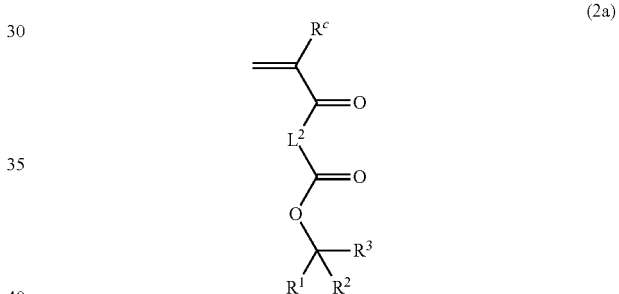
The first repeating unit is typically present in the first polymer in an amount from 20 to 70 mole percent (mol %), typically from 30 to 50 mol %, and more typically from 30 to 45 mol %, based on total repeating units in the first polymer.
The second repeating unit of the first polymer may be derived from a monomer of one or more of formulas (2a), (2b), (2c), (2d), or (2e):
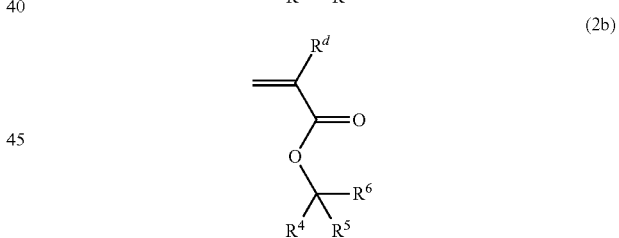
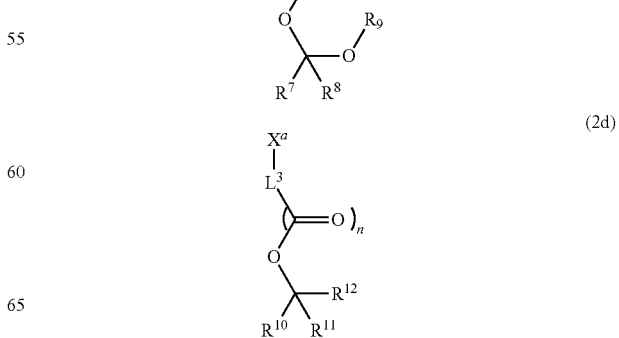

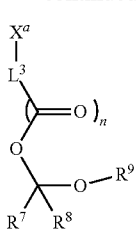

In formulas (2a) and (2b), $R^c$ and $R^d$ are each independently hydrogen, fluorine, cyano, substituted or unsubstituted $C_{1-10}$ alkyl, or substituted or unsubstituted $C_{1-10}$ fluoroalkyl. Preferably, $R^c$ is hydrogen, fluorine, or substituted or unsubstituted $C_{1-5}$ alkyl, typically methyl.

In formula (2a), $L^2$ is a divalent linking group. For example, $L^2$ may be a divalent linking group including at least one carbon atom, at least one heteroatom, or a combination thereof. For example, $L^2$ may include 1 to 10 carbon atoms and at least one heteroatom. In a typical example, $L^2$ may be —$OCH_2$—, —$OCH_2CH_2O$— or —$N(R^{41})$—, wherein $R^{41}$ is hydrogen or $C_{1-6}$ alkyl.

In formulas (2a) and (2b), $R^1$ to $R^6$ are each independently hydrogen, substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{2-20}$ alkenyl, substituted or unsubstituted $C_{3-20}$ cycloalkenyl, substituted or unsubstituted $C_{3-20}$ heterocycloalkenyl, substituted or unsubstituted $C_{6-20}$ aryl, or substituted or unsubstituted $C_{4-20}$ heteroaryl, provided that only one of $R^1$ to $R^3$ can be hydrogen and only one of $R^4$ to $R^6$ can be hydrogen.

In formula (2a), any two of $R^1$ to $R^3$ together optionally form a ring, and each of $R^1$ to $R^3$ optionally may include as part of their structure one or more groups selected from —O—, —C(O)—, —$N(R^{42})$—, —S—, or —$S(O)_2$—, wherein $R^{42}$ may be hydrogen, a straight chain or branched $C_{1-20}$ alkyl, monocyclic or polycyclic $C_{3-20}$ cycloalkyl, or monocyclic or polycyclic $C_{3-20}$ heterocycloalkyl. In formula (2b), any two of $R^4$ to $R^6$ together optionally form a ring, and each of $R^4$ to $R^6$ optionally may include as part of their structure one or more groups selected from —O—, —C(O)—, —$N(R^{42})$—, —S—, or —$S(O)_2$—, wherein $R^{43}$ is hydrogen, a straight chain or branched $C_{1-20}$ alkyl, monocyclic or polycyclic $C_{3-20}$ cycloalkyl, or monocyclic or polycyclic $C_{3-20}$ heterocycloalkyl. For example, any one or more of $R^1$ to $R^6$ can be independently a group of the formula —$CH_2C(=O)CH_{(3-n)}Y_n$, where each Y is independently substituted or unsubstituted $C_{3-10}$ heterocycloalkyl and n is 1 or 2. For example, each Y may be independently substituted or unsubstituted $C_{3-10}$ heterocycloalkyl including a group of the formula —$O(C^{a1})(C^{a2})O$—, wherein $C^{a1}$ and $C^{a2}$ are each independently hydrogen or substituted or unsubstituted $C_{1-10}$ alkyl, and where $C^{a1}$ and $C^{a2}$ together optionally form a ring.

In formula (2c), $R^7$ to $R^8$ may be each independently hydrogen, substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{6-20}$ aryl, or substituted or unsubstituted $C_{4-20}$ heteroaryl, and $R^9$ is unsubstituted or substituted $C_{1-20}$ alkyl, substituted or unsubstituted $C_{3-20}$ cycloalkyl, or substituted or unsubstituted $C_{3-20}$ heterocycloalkyl. Optionally, one of $R^7$ or $R^8$ together with $R^9$ forms a heterocyclic ring. Preferably, $R^7$ and $R^8$ may be each independently hydrogen, substituted or unsubstituted $C_{1-20}$ alkyl, substituted or unsubstituted $C_{3-20}$ cycloalkyl, or substituted or unsubstituted $C_{3-20}$ heterocycloalkyl.

In formula (2d), $R^{10}$ to $R^{12}$ may be each independently substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{6-20}$ aryl, or substituted or unsubstituted $C_{4-20}$ heteroaryl, any two of $R^{10}$ to $R^{12}$ together optionally form a ring, and each of $R^{10}$ to $R^{12}$ optionally may include as part of their structure one or more groups selected from —O—, —C(O)—, —$N(R^{44})$—, —S—, or —$S(O)_2$—, wherein $R^{44}$ may be hydrogen, straight chain or branched $C_{1-20}$ alkyl, monocyclic or polycyclic $C_{3-20}$ cycloalkyl, or monocyclic or polycyclic $C_{3-20}$ heterocycloalkyl; $X^a$ is a polymerizable group selected from vinyl or norbornyl; and $L^3$ is a single bond or a divalent linking group, provided that $L^3$ is not a single bond when $X^a$ is vinyl. Preferably, $L^3$ is substituted or unsubstituted $C_{6-30}$ arylene or substituted or unsubstituted $C_{3-20}$ cycloalkylene. In formula (2d), n is 0 or 1. It is to be understood that when n is 0, the $L^3$ group is connected directly to the oxygen atom.

Non-limiting examples of monomers (2a) include:

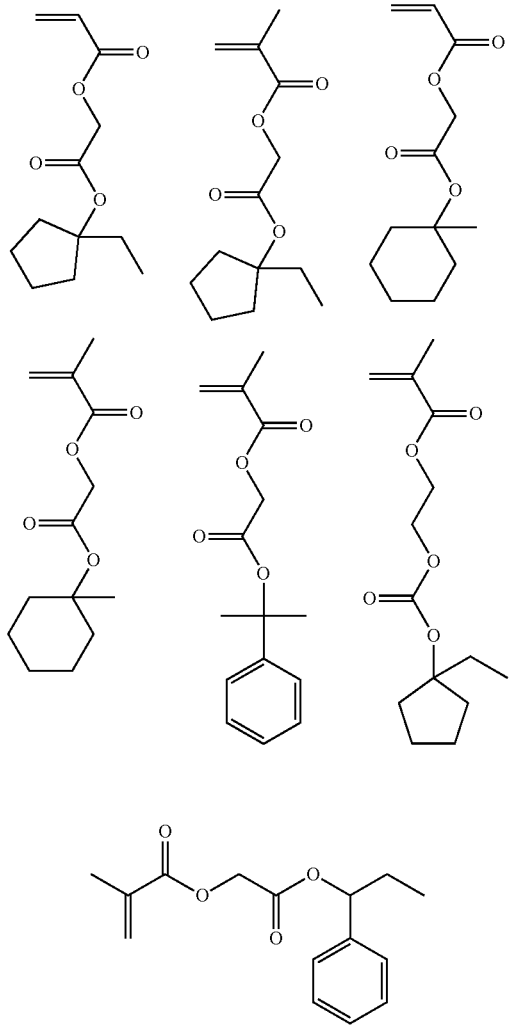

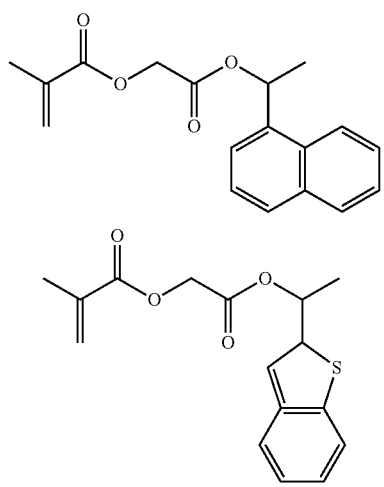
Non-limiting examples of monomers of formula (2b) include:
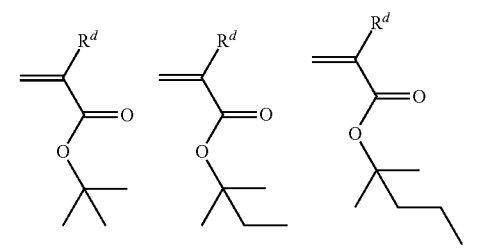
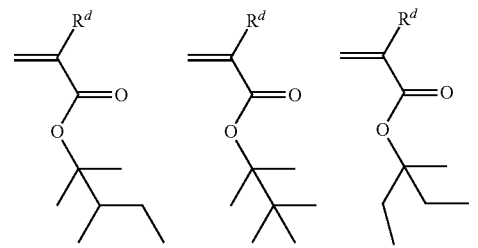
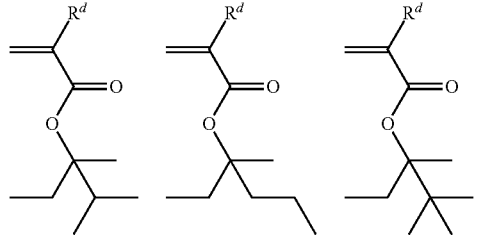
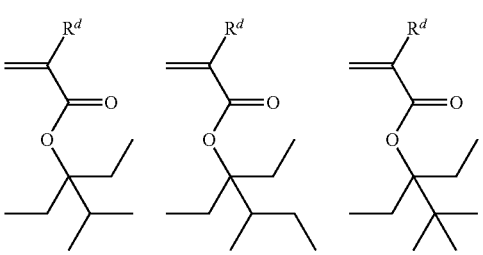
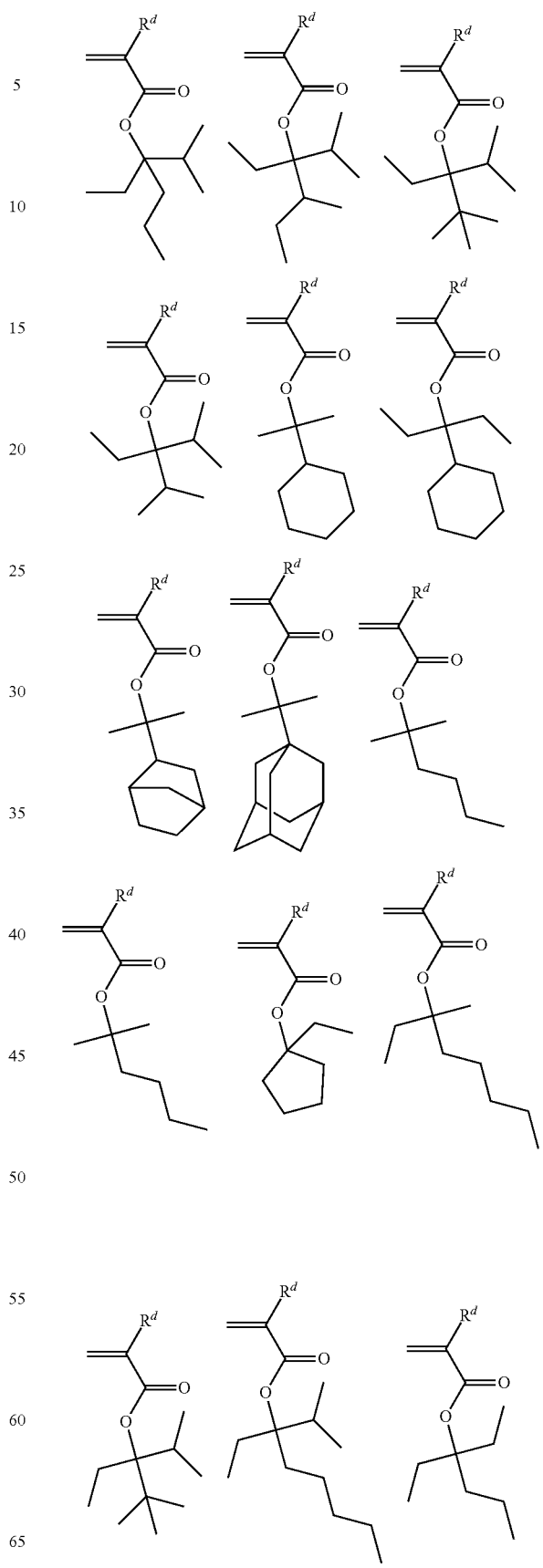

-continued

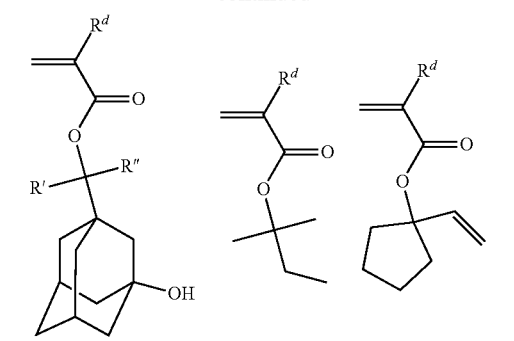

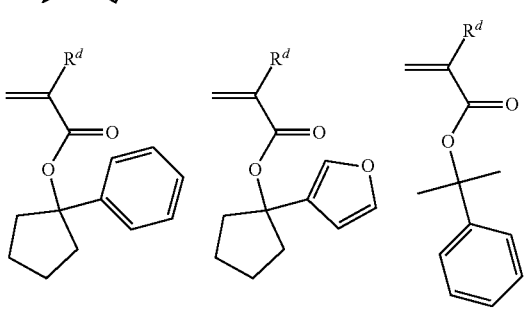

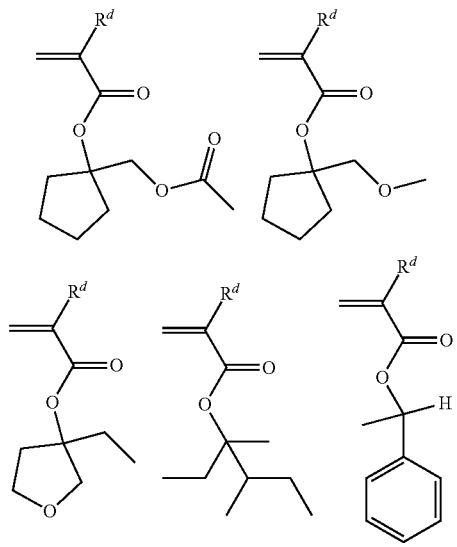

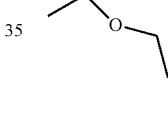

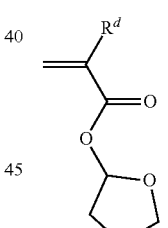

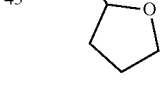

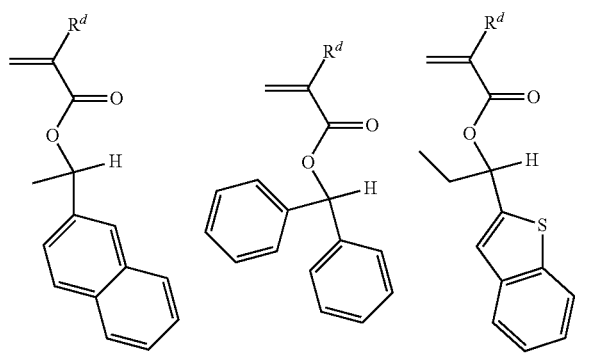

-continued

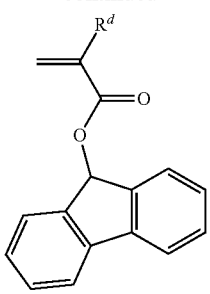

wherein $R^d$ is as defined above; and R' and R" are each independently substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{2-20}$ alkenyl, substituted or unsubstituted $C_{3-20}$ cycloalkenyl, substituted or unsubstituted $C_{3-20}$ heterocycloalkenyl, substituted or unsubstituted $C_{6-20}$ aryl, or substituted or unsubstituted $C_{4-20}$ heteroaryl.

Non-limiting examples of monomers of formula (2c) include:

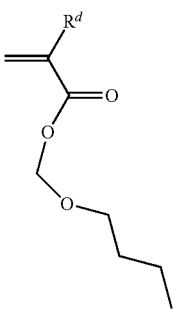

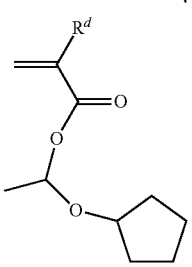

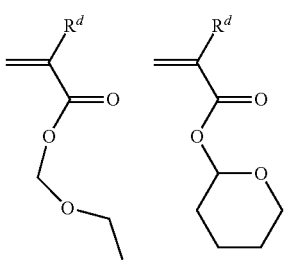

wherein $R^d$ is as defined above.

Non-limiting examples of monomers (2d) include:
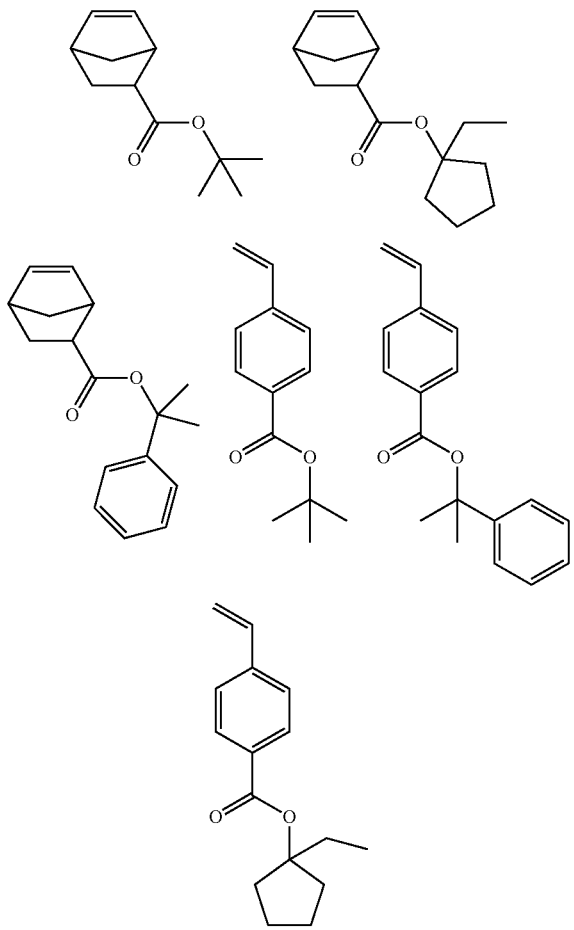
Non-limiting examples of monomers (2e) include:
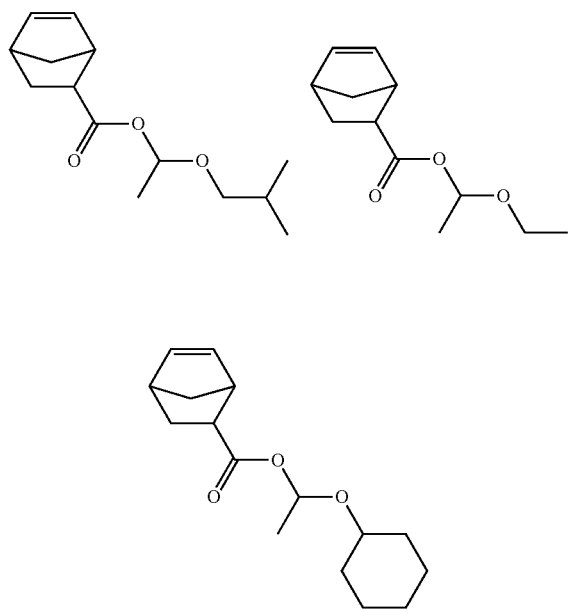
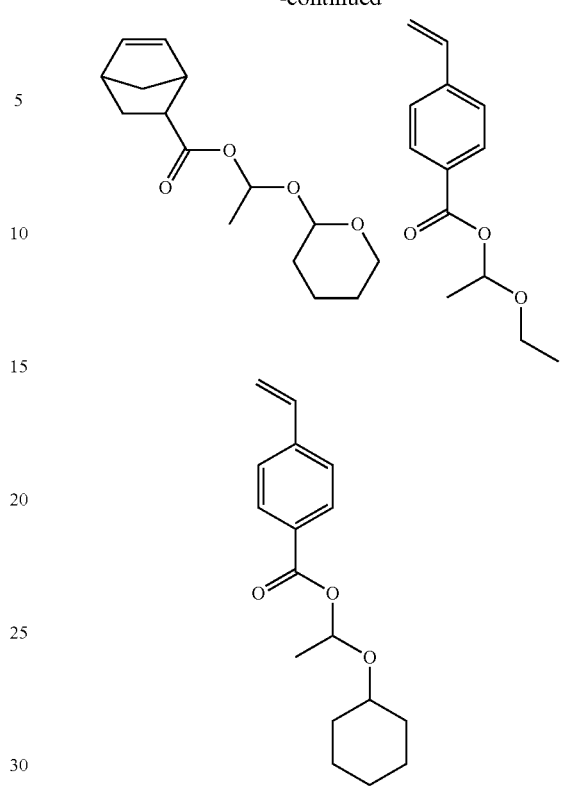
In still another example, the second repeating unit of the first polymer may be derived from a monomer having a cyclic acetal or cyclic ketal group, for example, of the formulas:
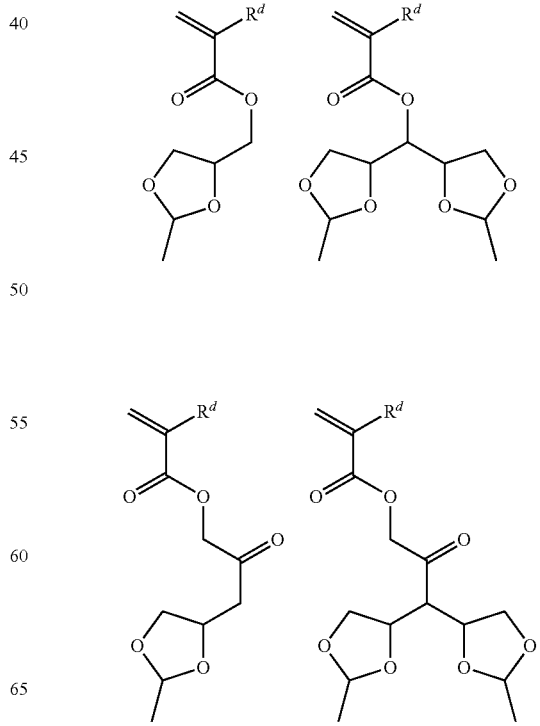

-continued

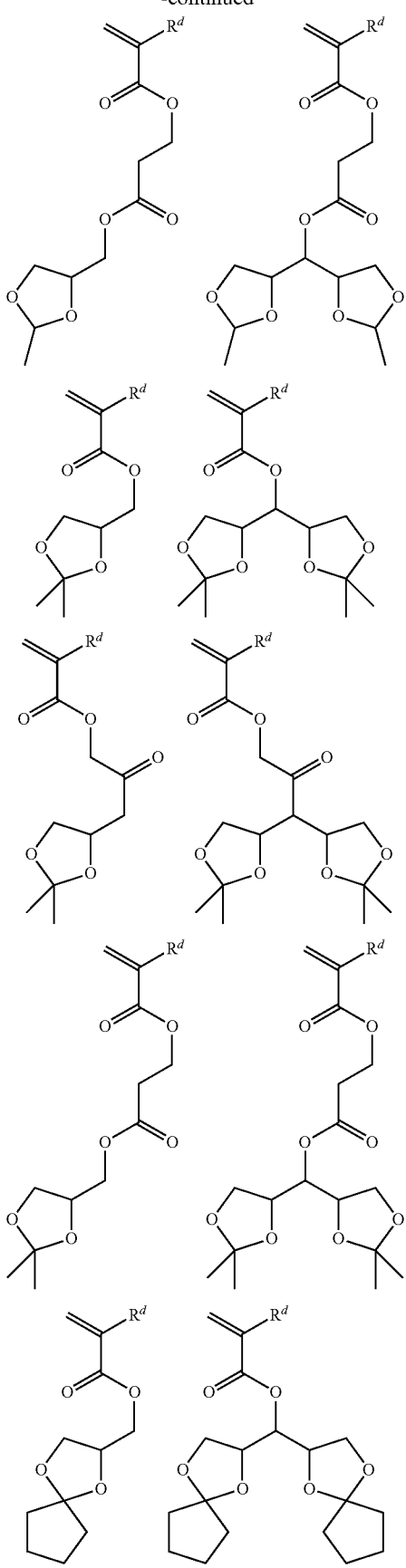

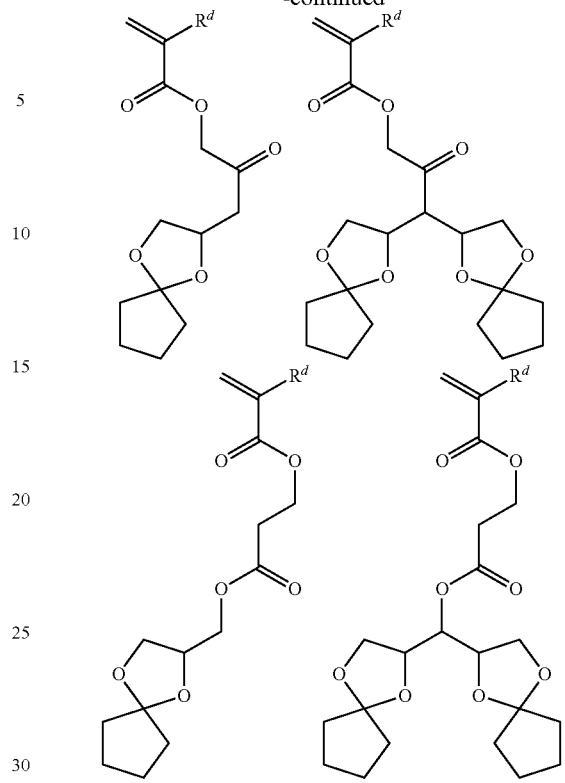

wherein $R^d$ is as defined above.

In still another example, the second repeating unit of the first polymer may be derived from a monomer having a tertiary alkoxy group, for example, of the formulas:

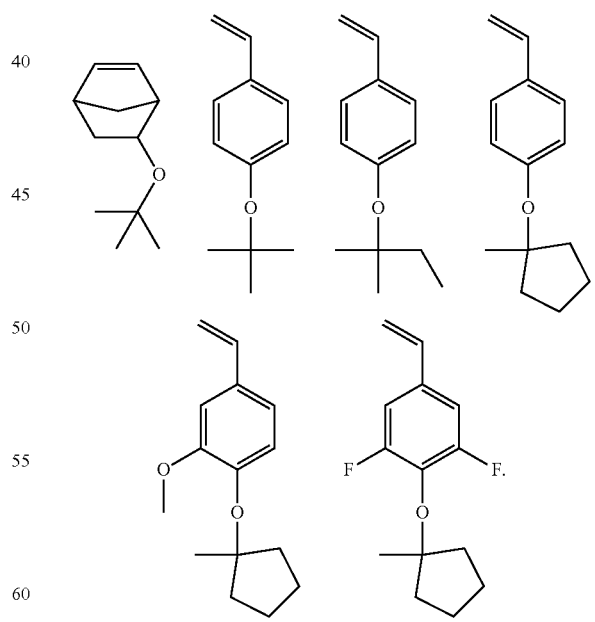

The second repeating unit is typically present in the first polymer in an amount from 25 to 65 mole percent (mol %), typically from 30 to 50 mol %, and more typically from 30 to 45 mol %, based on total repeating units in the first polymer.

For example, the first polymer may be a polymer having a formula:
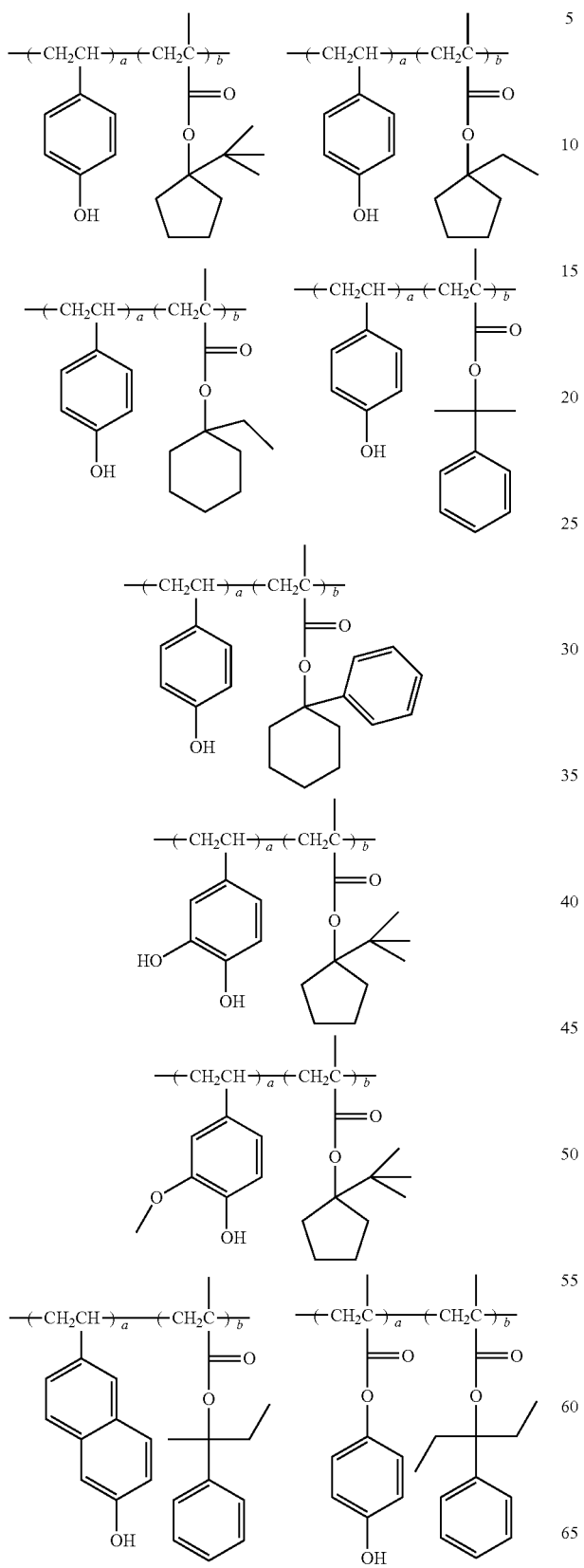
-continued
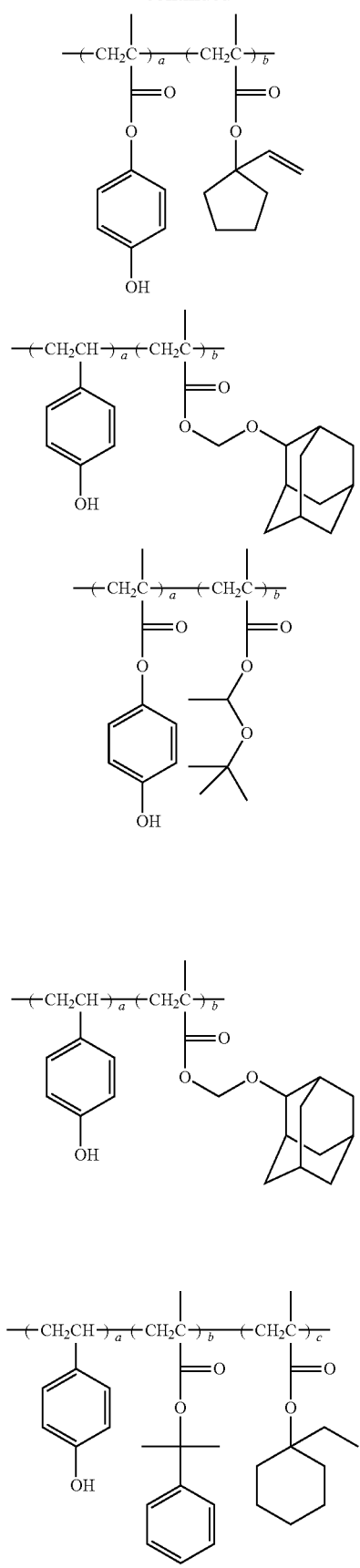

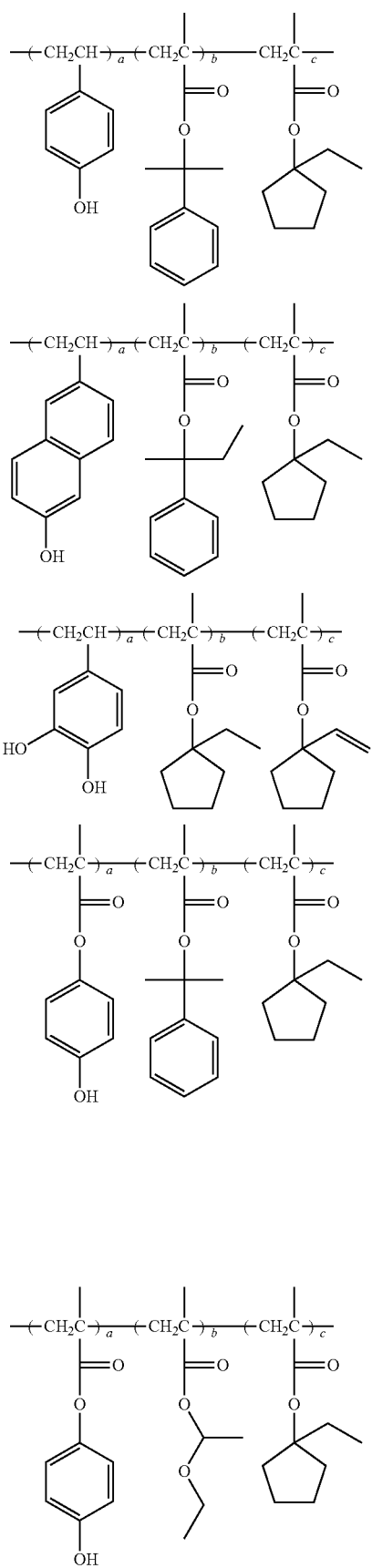

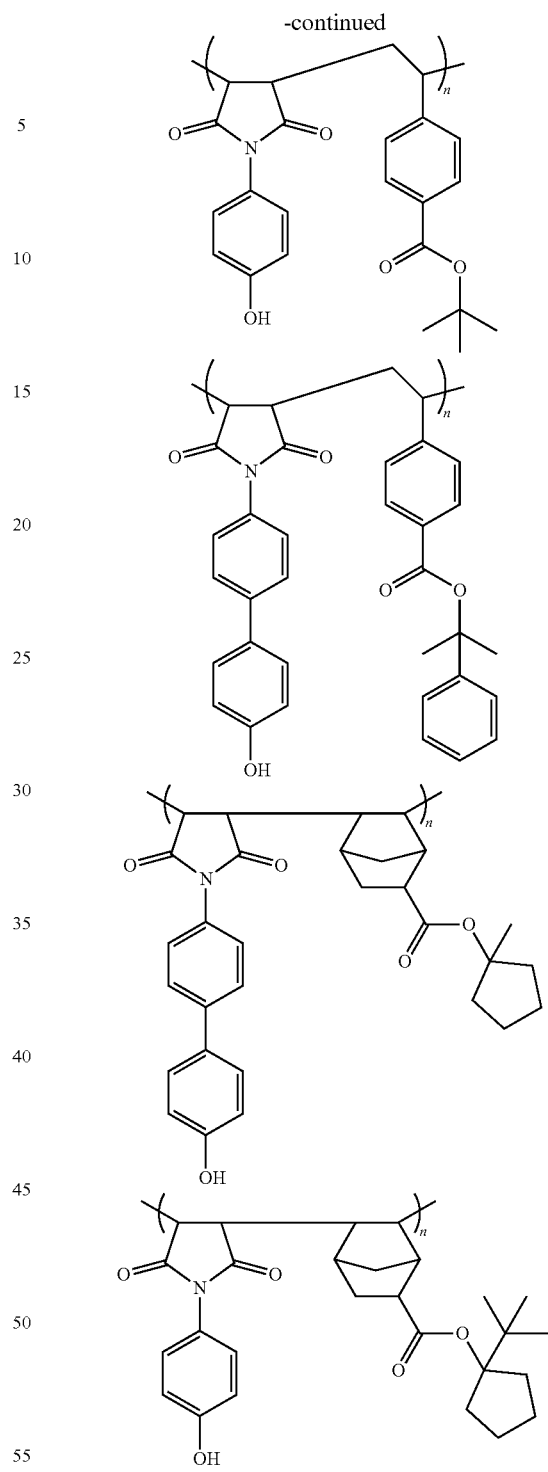

wherein a, b, and optionally c each represent mole fractions of the corresponding repeating unit, and n is an integer from 10 to 1,000.

The photoresist composition further comprises a photoacid generator (PAG). Suitable PAGs can generate an acid that, during post-exposure bake (PEB), causes cleavage of acid-labile groups present on a polymer of the photoresist composition. The PAG may be included as a non-polymerized PAG compound (as disclosed below), as a repeating unit of a polymer having a PAG moiety that is derived from a polymerizable PAG compound, or a combination thereof. For example, the first polymer optionally may comprise a repeating unit comprising a PAG, for example a repeating unit derived from one or more monomers of formula (3):

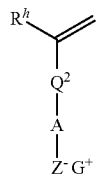

(3)

In formula (3), $R^h$ is hydrogen, fluorine, cyano, substituted or unsubstituted $C_{1-10}$ alkyl, or substituted or unsubstituted $C_{1-10}$ fluoroalkyl. Preferably, $R^h$ is hydrogen, fluorine, or substituted or unsubstituted $C_{1-5}$ alkyl, typically methyl. $Q^2$ is a single bond or a divalent linking group chosen from one or more of a heteroatom, substituted or unsubstituted $C_{1-30}$ alkylene, substituted or unsubstituted $C_{3-30}$ cycloalkylene, substituted or unsubstituted $C_{1-30}$ heterocycloalkylene, substituted or unsubstituted $C_{6-30}$ arylene, substituted or unsubstituted divalent $C_{7-30}$ arylalkyl, substituted or unsubstituted $C_{1-30}$ heteroarylene, or substituted or unsubstituted divalent $C_{3-30}$ heteroarylalkyl, or a combination thereof. Preferably, $Q^2$ may include 1 to 10 carbon atoms and at least one heteroatom, more preferably —C(O)—O—.

In formula (3), A is one or more of substituted or unsubstituted $C_{1-30}$ alkylene, substituted or unsubstituted $C_{3-30}$ cycloalkylene, substituted or unsubstituted $C_{1-30}$ heterocycloalkylene, substituted or unsubstituted $C_{6-30}$ arylene, substituted or unsubstituted divalent $C_{7-30}$ arylalkyl, substituted or unsubstituted $C_{1-30}$ heteroarylene, or substituted or unsubstituted divalent $C_{3-30}$ heteroarylalkyl. Preferably, A is a divalent $C_{1-30}$ perfluoroalkyl group that is optionally substituted.

In formula (3), $Z^-$ is an anionic moiety comprising sulfonate, an anion of a sulfonamide, an anion of a sulfonimide, or a methide anion. $G^+$ is an organic cation as described below.

Exemplary monomers of formula (3) include the following:

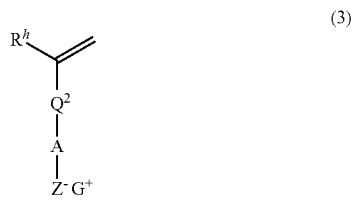

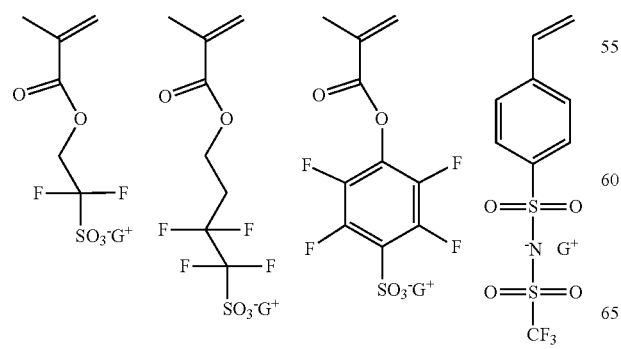

-continued

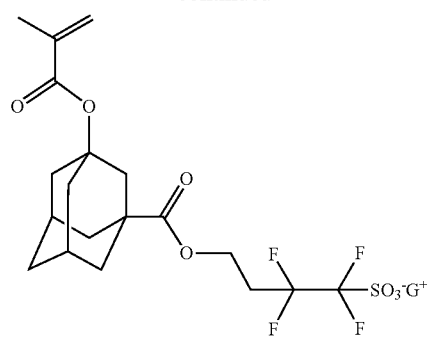

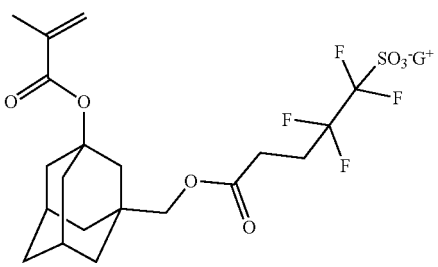

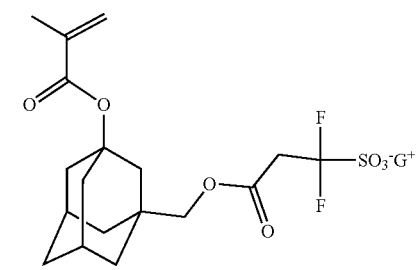

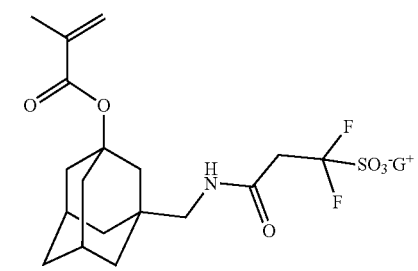

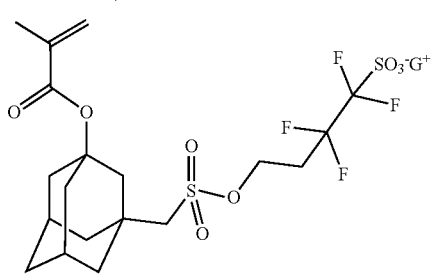

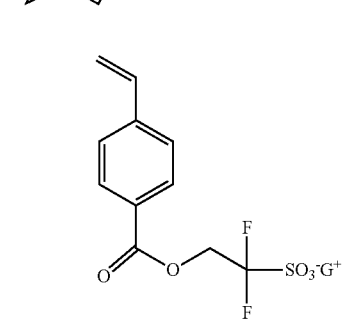

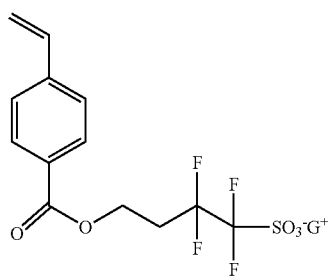

wherein G⁺ is an organic cation. Organic cations include, for example, iodonium cations substituted with two alkyl groups, aryl groups, or a combination of alkyl and aryl groups; and sulfonium cations substituted with three alkyl groups, aryl groups, or a combination of alkyl and aryl groups. In some embodiments, G⁺ is an iodonium cation substituted with two alkyl groups, aryl groups, or a combination of alkyl and aryl groups; or a sulfonium cation substituted with three alkyl groups, aryl groups, or a combination of alkyl and aryl groups. In some embodiments, G⁺ is a substituted sulfonium cation having the formula (3A) or an iodonium cation having the formula (3B):

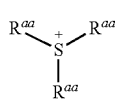  (3A)

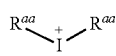  (3B)

wherein, each $R^{aa}$ is independently a $C_{1-20}$ alkyl group, a $C_{1-20}$ fluoroalkyl group, a $C_{3-20}$ cycloalkyl group, a $C_{3-20}$ fluorocycloalkyl group, a $C_{2-20}$ alkenyl group, a $C_{2-20}$ fluoroalkenyl group, a $C_{6-30}$ aryl group, a $C_{6-30}$ fluoroaryl group, a $C_{6-30}$ iodoaryl group, a $C_{1-30}$ heteroaryl group, a $C_{7-20}$ arylalkyl group, a $C_{7-20}$ fluoroarylalkyl group, a $C_{2-20}$ heteroarylalkyl group, or a $C_{2-20}$ fluoroheteroarylalkyl group, each of which is substituted or unsubstituted, wherein each $R^{aa}$ is either separate or connected to another group $R^{aa}$ via a single bond or a divalent linking group to form a ring. Each $R^{aa}$ optionally may include as part of its structure one or more groups selected from —O—, —C(O)—, or —$C_{1-12}$ hydrocarbylene—. Each R' independently may optionally comprise an acid-labile group chosen, for example, from tertiary alkyl ester groups, secondary or tertiary aryl ester groups, secondary or tertiary ester groups having a combination of alkyl and aryl groups, tertiary alkoxy groups, acetal groups, or ketal groups. Suitable divalent linking groups for connection of $R^{aa}$ groups include, for example, —O—, —S—, —Te—, —Se—, —C(O)—, —C(S)—, —C(Te)—, —C(Se)—, S(O)—, S(O)₂—, or —N(R)—, wherein R is hydrogen, straight chain or branched $C_{1-20}$ alkyl, substituted or unsubstituted $C_{3-20}$ cycloalkyl, or substituted or unsubstituted $C_{3-20}$ heterocycloalkyl, or substituted or unsubstituted $C_{1-5}$ alkylene.

Exemplary sulfonium cations of formula (3A) include the following:

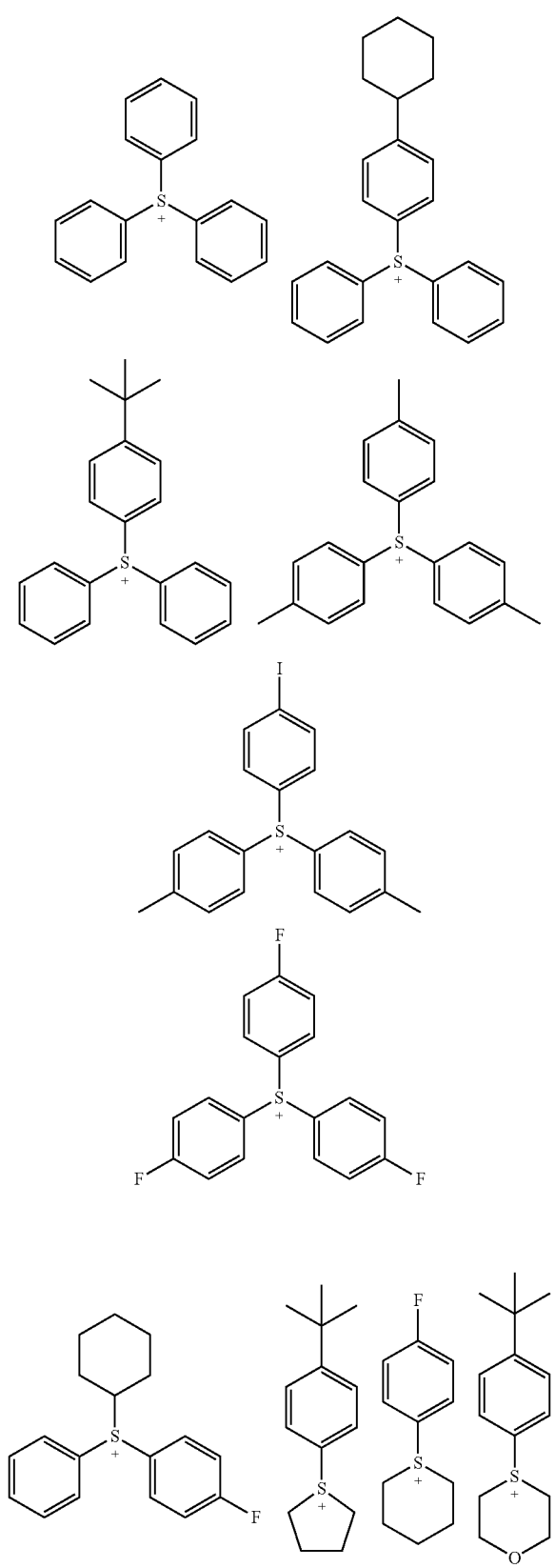

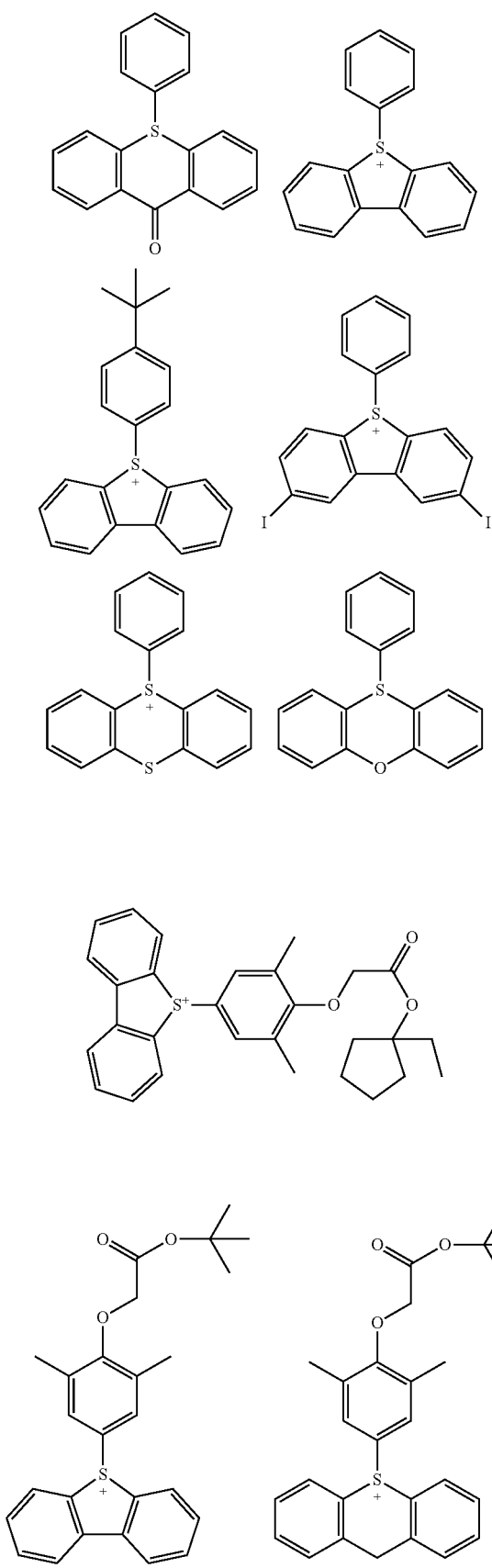
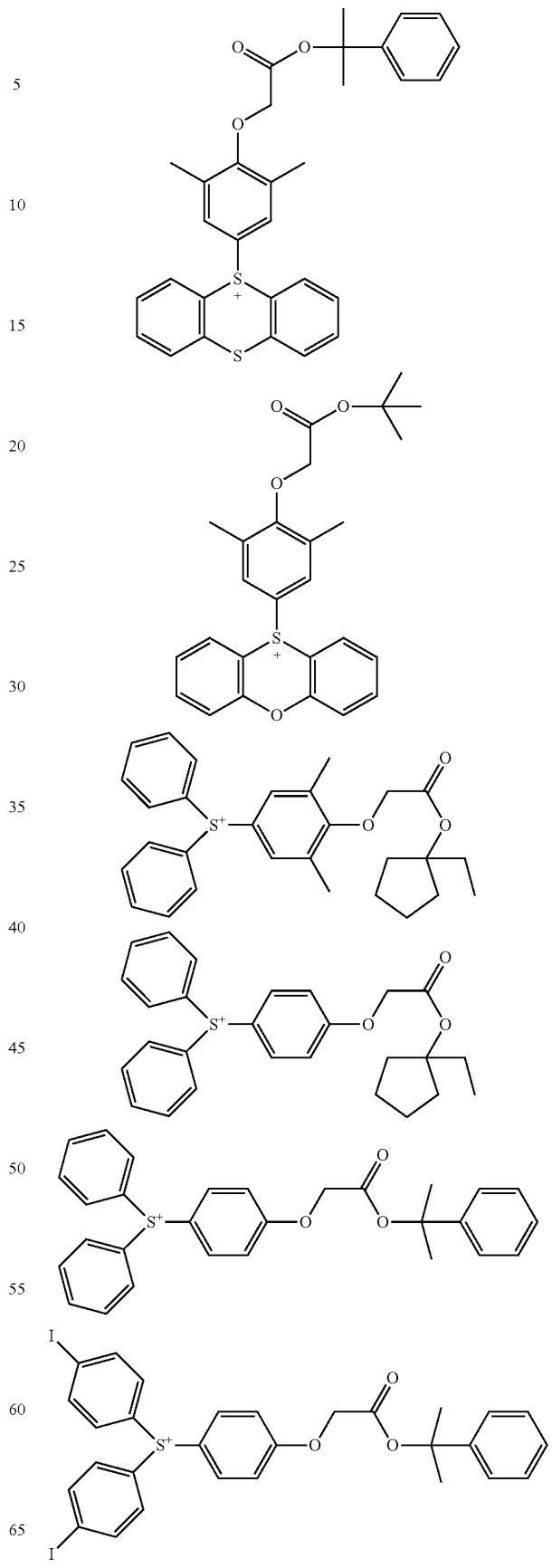

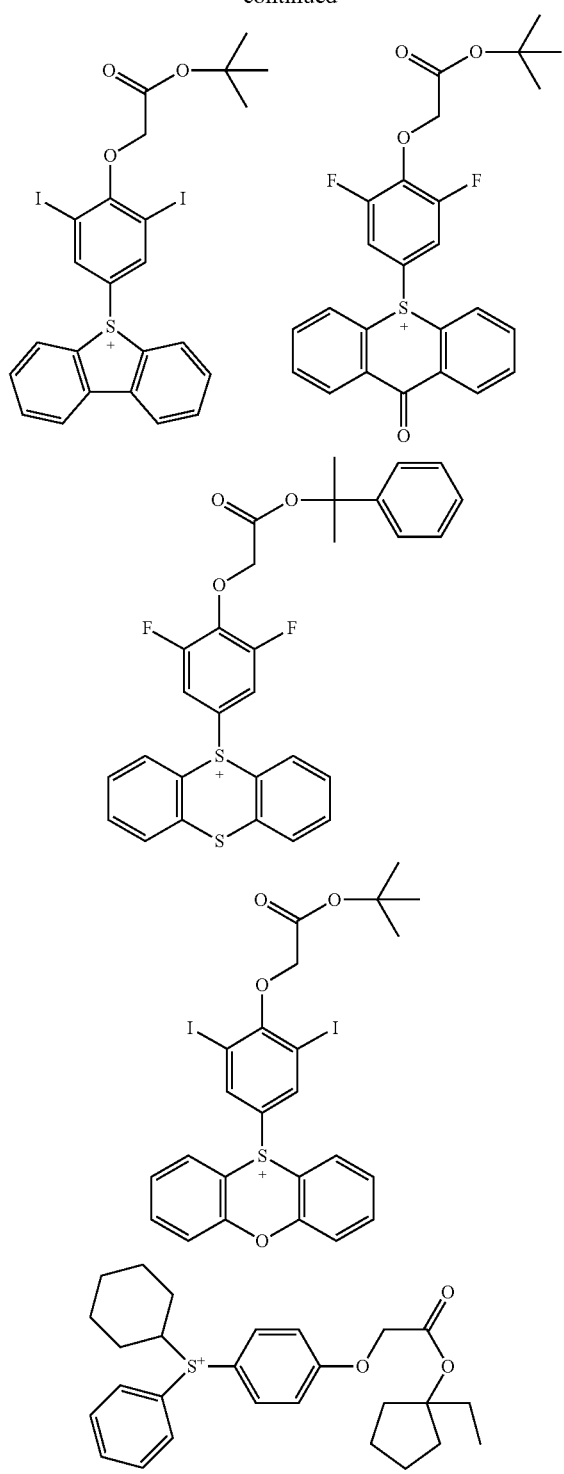
Exemplary iodonium cations of formula (3B) include the following:
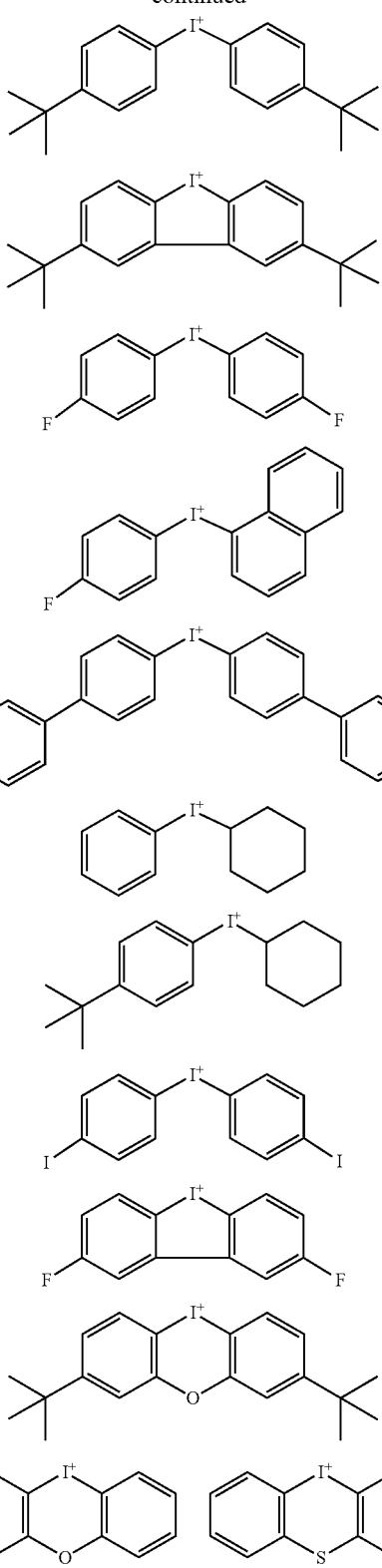
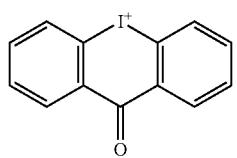

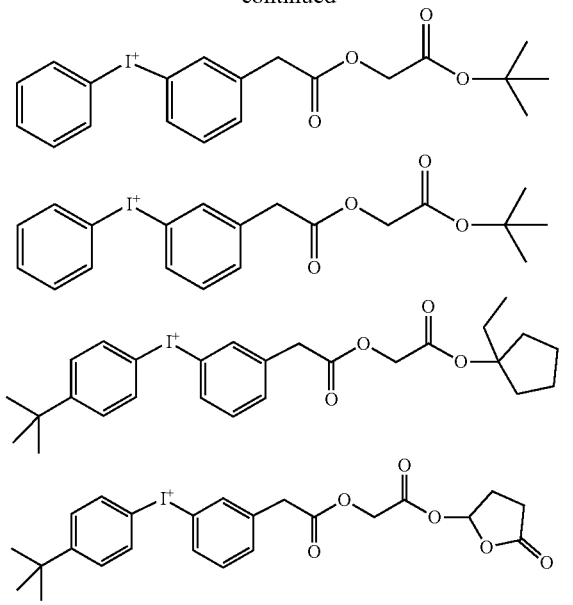

The first polymer may include a repeating unit comprising a photoacid generator. If used in the first polymer, such unit(s) is typically present in an amount from 1 to 10 mol %, typically from 1 to 8 mol %, and more typically from 2 to 6 mol %, based on total repeating units in the first polymer.

The first polymer may optionally include one or more additional repeating units different from the first repeating unit, the second repeating unit, and if present the repeating unit comprising a photoacid generator. The additional repeating units may include, for example, one or more additional units for purposes of adjusting properties of the photoresist composition, such as etch rate and solubility. Exemplary additional units may include one or more of (meth)acrylate, vinyl ether, vinyl ketone, and vinyl ester. The one or more additional repeating units if present in the first polymer may be used in an amount of up to 70 mol %, and typically from 3 to 50 mol %, based on total repeating units of the first polymer.

The first polymer typically has a weight average molecular weight ($M_w$) from 1,000 to 50,000 Daltons (Da), specifically from 2,000 to 30,000 Da, more specifically from 3,000 to 20,000 Da, and still more specifically from 3,000 to 10,000 Da. The polydispersity index (PDI) of the first polymer, which is the ratio of $M_w$ to number average molecular weight ($M_n$) is typically from 1.1 to 3, and specifically from 1.1 to 2. Molecular weight values are determined by gel permeation chromatography (GPC) using polystyrene standards.

The second polymer comprises a first repeating unit comprising an acid-labile group, a second repeating unit comprising a lactone group, and a third repeating unit comprising a base-soluble group. The base-soluble group has a pKa of less than or equal to 12, preferably from 2 to 12, more preferably from 3 to 9, and most preferably from 4 to 8, and the base-soluble group does not comprise a hydroxy-substituted aryl group. The pKa is typically measured in an aqueous solution at 25° C. and may be determined experimentally, for example, by potentiometric titration such as by using a potentiometric pH meter available from Sirius Analytical Instruments Ltd., or may be calculated, for example, by using Advanced Chemistry Development (ACD) Labs Software Version 11.02. When an acid value of a functional group having a relatively high pKa (e.g., a —C(CF$_3$)$_2$OH group) is to be measured, a non-aqueous titrant such as an organic solvent or organic solvent mixture may be used.

The first repeating unit of the second polymer may be derived from a monomer of formulas (2a), (2b), (2c), or (2d) as disclosed for the first polymer. The first repeating unit of the first polymer may be the same as or different from the second repeating unit of the second polymer.

The second repeating unit of the second polymer may be derived from a monomer of formula (4):

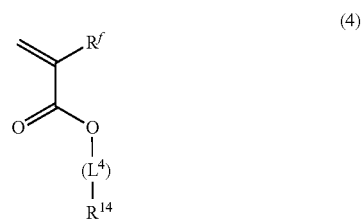

(4)

In formula (4), $R^f$ is hydrogen, fluorine, cyano, substituted or unsubstituted C$_{1-10}$ alkyl, or substituted or unsubstituted C$_{1-10}$ fluoroalkyl. Preferably, $R^f$ is hydrogen, fluorine, or substituted or unsubstituted C$_{1-5}$ alkyl, typically methyl. L$^4$ may be a single bond or a divalent linking group, for example, a single bond or a divalent linking group comprising one or more of substituted or unsubstituted C$_{1-30}$ alkylene, substituted or unsubstituted C$_{1-30}$ heteroalkylene, substituted or unsubstituted C$_{3-30}$ cycloalkylene, substituted or unsubstituted C$_{1-30}$ heterocycloalkylene, substituted or unsubstituted C$_{6-30}$ arylene, substituted or unsubstituted C$_{7-30}$ arylalkylene, or substituted or unsubstituted C$_{1-30}$ heteroarylene, or substituted or unsubstituted C$_{3-30}$ heteroarylalkylene, wherein L$^4$ optionally may further include one or more groups chosen, for example, from —O—, —C(O)—, —N(R$^{44}$)—, —S—, or —S(O)$_2$—, wherein R$^{44}$ may be hydrogen, a straight chain or branched C$_{1-20}$ alkyl, monocyclic or polycyclic C$_{3-20}$ cycloalkyl, or monocyclic or polycyclic C$_{3-20}$ heterocycloalkyl. R$^{14}$ may be a monocyclic, polycyclic, or fused polycyclic C$_{4-20}$ lactone-containing group.

Non-limiting examples of monomers of formula (4) include:

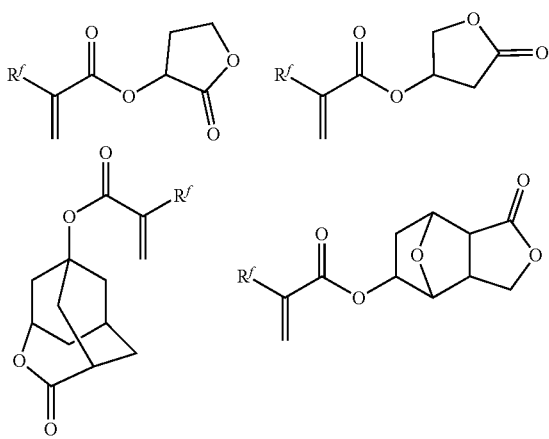

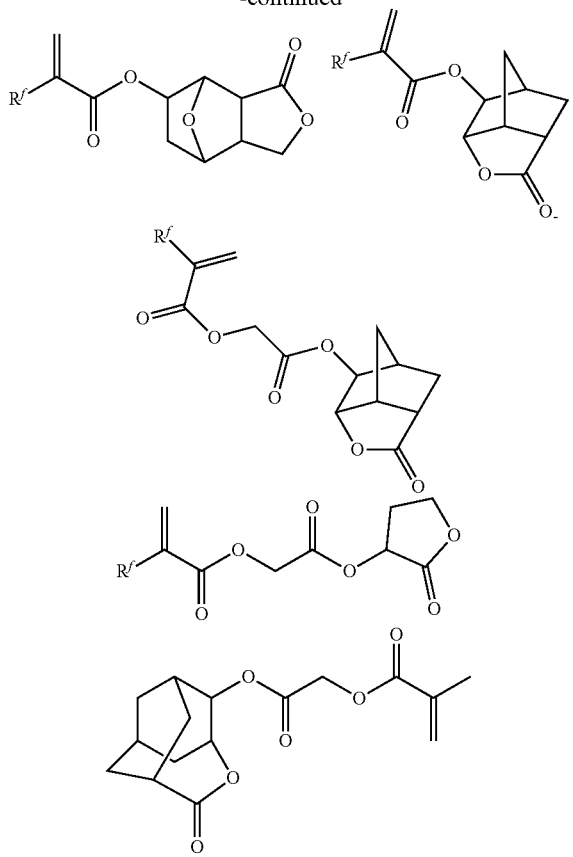

wherein $R^f$ is as disclosed herein.

The third repeating unit of the second polymer comprises a base-soluble group having a pKa of less than or equal to 12, and does not include a hydroxy-aryl group as part of the structure. For example, the third repeating unit can be derived from a monomer of formula (5):

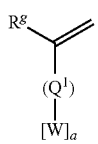
(5)

with the proviso that the third repeating unit has a pKa of less than or equal to 12 and does not comprise a hydroxy-aryl group.

In formula (5), $R^g$ may be hydrogen, fluorine, cyano, substituted or unsubstituted $C_{1-10}$ alkyl, or substituted or unsubstituted $C_{1-10}$ fluoroalkyl. Preferably, $R^g$ is hydrogen, fluorine, or substituted or unsubstituted $C_{1-5}$ alkyl, typically methyl. $Q^1$ may be one or more of substituted or unsubstituted $C_{1-30}$ alkylene, substituted or unsubstituted $C_{3-30}$ cycloalkylene, substituted or unsubstituted $C_{1-30}$ heterocycloalkylene, substituted or unsubstituted $C_{6-30}$ arylene, substituted or unsubstituted divalent $C_{7-30}$ arylalkyl, substituted or unsubstituted $C_{1-30}$ heteroarylene, substituted or unsubstituted divalent $C_{3-30}$ heteroarylalkyl, or —C(O)—O—. W is a base-soluble group and can be chosen, for example, from —C(O)—OH; a fluorinated alcohol such as —C(CF$_3$)$_2$OH;

an amide; an imide; or —NH—S(O)$_2$—Y$^1$ where Y$^1$ is F or $C_{1-4}$ perfluoroalkyl. In formula (5), a is an integer from 1 to 3.

Non-limiting examples of monomers of formula (5) include:

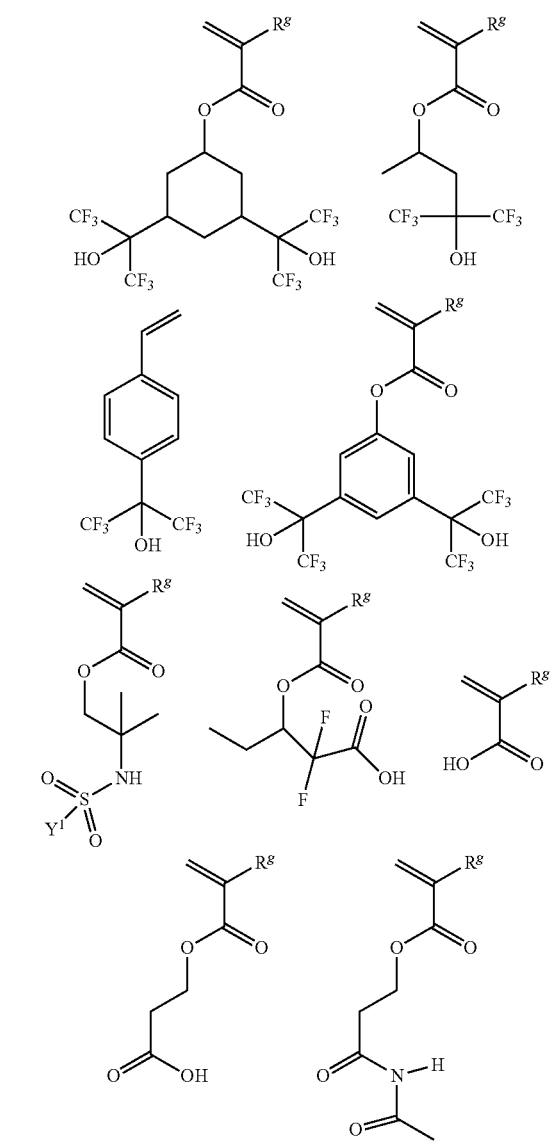

wherein $R^g$ and $Y^1$ are as described above.

Typically, the second polymer comprises the first repeating unit in an amount from 20 to 60 mol %, typically from 25 to 55 mol %, and more typically from 30 to 50 mol %; the second repeating unit in an amount from 30 to 55 mol %, typically from 35 to 55 mol %, and more typically from 35 to 50 mol %; and the third repeating unit in an amount from 1 to 50 mol %, typically from 2 to 25 mol %, and more typically from 2 to 20 mol %, each based on total repeating units in the second polymer.

The second polymer may optionally include one or more additional repeating units different from the first repeating unit, the second repeating unit, and the third repeating unit. For example, the second polymer may optionally include one or more additional repeating units as described above for the optional additional repeating units of the first polymer. The one or more additional units if present in the second polymer may be used in an amount of up to 70 mol %, and typically from 3 to 50 mol %, based on total repeating units in the second polymer.
Non-limiting examples of the second polymer include the following:
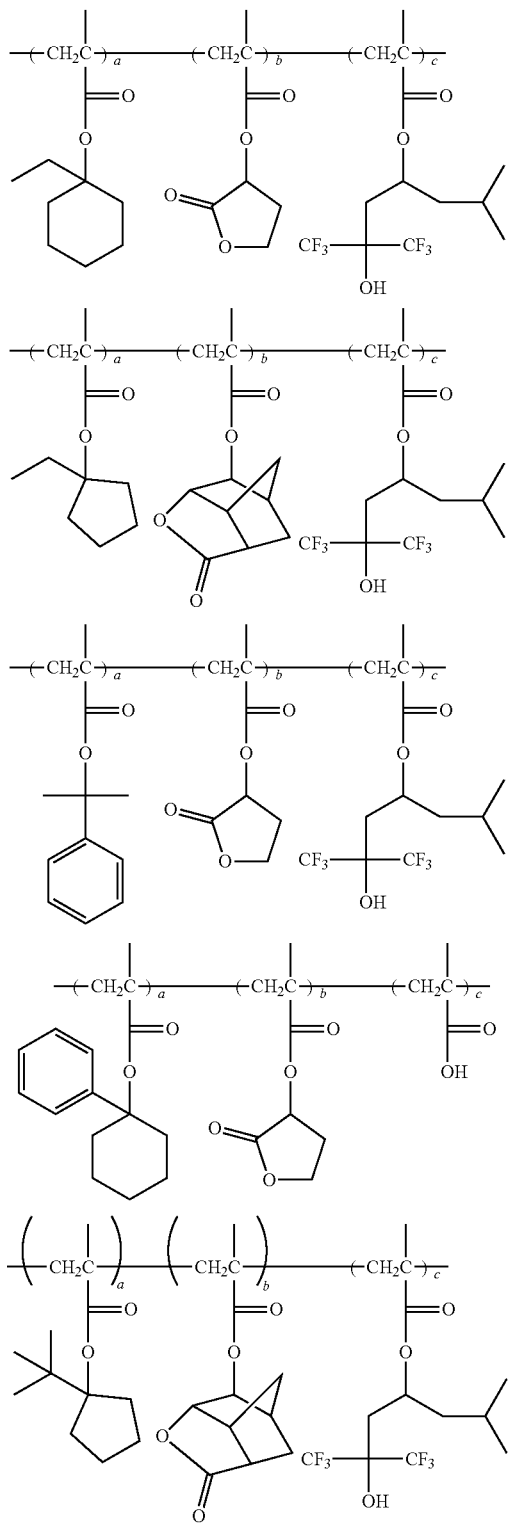
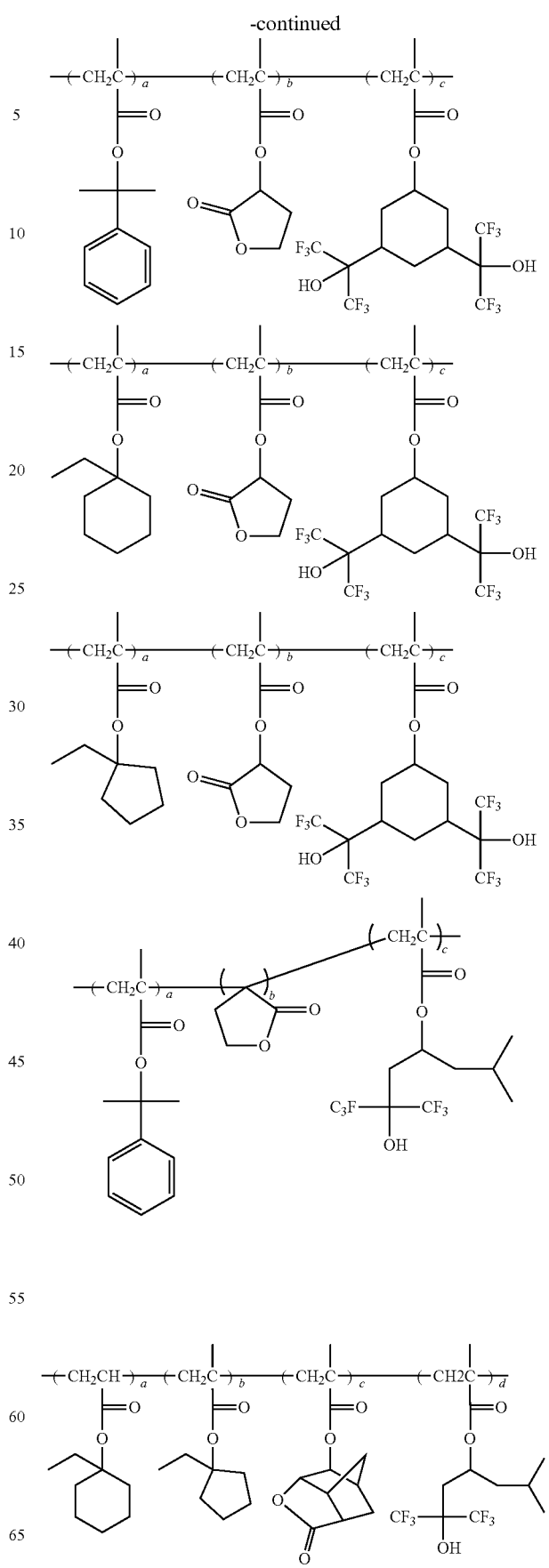

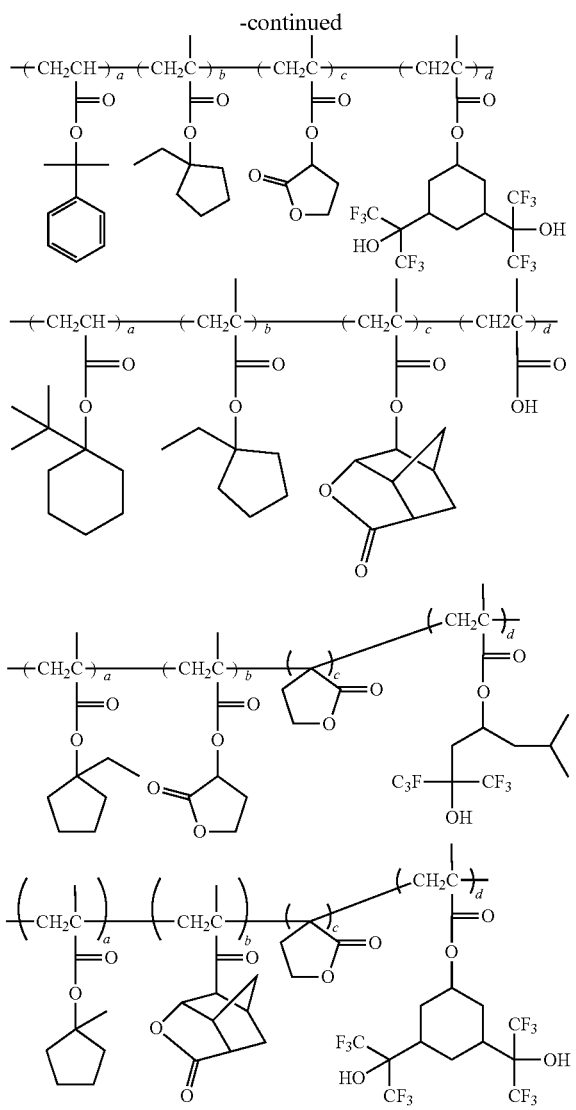

wherein a, b, c, and optionally d represent mole fractions of the corresponding repeating units.

The second polymer may optionally comprise a repeating unit comprising a PAG that is derived from a monomer of formula (3), as disclosed above. The second polymer may include a repeating unit comprising a photoacid generator in an amount from 1 to 10 mol %, typically from 1 to 8 mol %, and more typically from 2 to 6 mol %, based on total repeating units in the second polymer.

The second polymer typically has a $M_w$ from 1,000 to 50,000 Da, specifically from 2,000 to 30,000 Da, more specifically from 3,000 to 20,000 Da, still more specifically from 3,000 to 10,000 Da. The PDI of the polymer, which is the ratio of $M_w$ to $M_n$ is typically from 1.1 to 3, and specifically from 1.1 to 2. Molecular weights are determined by GPC using polystyrene standards.

The first and second polymers may be prepared using any suitable methods in the art. For example, one or more monomers corresponding to the repeating units described herein may be combined, or fed separately, using suitable solvent(s) and initiator, and polymerized in a reactor. For example, the first and second polymers may be obtained by polymerization of the respective monomers under any suitable conditions, such as by heating at an effective temperature, irradiation with actinic radiation at an effective wavelength, or a combination thereof.

The photoresist composition typically includes the first polymer and the second polymer in a weight ratio from 1:4 to 4:1, for example, from 1:4 to 4:1, or from 1:3 to 3:1, or from 1:2 to 2:1.

In the photoresist compositions of the invention, the first polymer and the second polymer are typically present together in the photoresist composition in an amount of from 10 to 99.9 wt %, typically from 25 to 99 wt %, and more typically from 50 to 95 wt %, based on total solids of the photoresist composition. It will be understood that total solids includes the first and second polymers, PAGs, and other non-solvent components.

In some aspects, the photoresist composition may further include a material that comprises one or more base-labile groups (a "base-labile material"). As referred to herein, base-labile groups are functional groups that can undergo cleavage reaction to provide polar groups such as hydroxyl, carboxylic acid, sulfonic acid, and the like, in the presence of an aqueous alkaline developer after exposure and post-exposure baking steps. The base-labile group will not react significantly (e.g., will not undergo a bond-breaking reaction) prior to a development step of the photoresist composition that comprises the base-labile group. Thus, for instance, a base-labile group will be substantially inert during pre-exposure soft-bake, exposure, and post-exposure bake steps. By "substantially inert" it is meant that ≤5%, preferably ≤1%, of the base-labile groups (or moieties) will decompose, cleave, or react during the pre-exposure soft-bake, exposure, and post-exposure bake steps. The base-labile group is reactive under typical photoresist development conditions using, for example, an aqueous alkaline photoresist developer such as a 0.26 normal (N) aqueous solution of tetramethylammonium hydroxide (TMAH). For example, a 0.26 N aqueous solution of TMAH may be used for single puddle development or dynamic development, e.g., where the 0.26 N TMAH developer is dispensed onto an imaged photoresist layer for a suitable time such as from 10 to 120 seconds (s). An exemplary base-labile group is an ester group, typically a fluorinated ester group. Preferably, the base-labile material is substantially not miscible with and has a lower surface energy than the first and second polymers, and other solid components of the photoresist composition. When coated on a substrate, the base-labile material can thereby segregate from other solid components of the photoresist composition to a top surface of the formed photoresist layer.

In some aspects, the base-labile material is a polymeric material, also referred to herein as a base-labile polymer, that may include one or more repeating units comprising one or more base-labile groups. For example, the base-labile polymer may comprise a repeating unit comprising 2 or more base-labile groups that are the same or different. A preferred base-labile polymer comprises at least one repeating unit comprising 2 or more base-labile groups, for example a repeating unit comprising 2 or 3 base-labile groups.

The base-labile polymer may be a polymer comprising a repeating unit derived from a monomer of formula (E1)

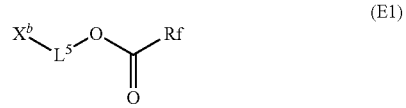

(E1)

wherein $X^b$ is a polymerizable group selected from vinyl and acrylic, $L^5$ is a divalent linking group comprising one or more of substituted or unsubstituted linear or branched $C_{1-20}$ alkylene, substituted or unsubstituted $C_{3-20}$ cycloalkylene, —C(O)—, or —C(O)O—; and $R^f$ is substituted or unsubstituted $C_{1-20}$ fluoroalkyl group provided that the carbon atom bonded to the carbonyl (C=O) in formula (E1) is substituted with at least one fluorine atom.

Exemplary monomers of formula (E1) include the following:

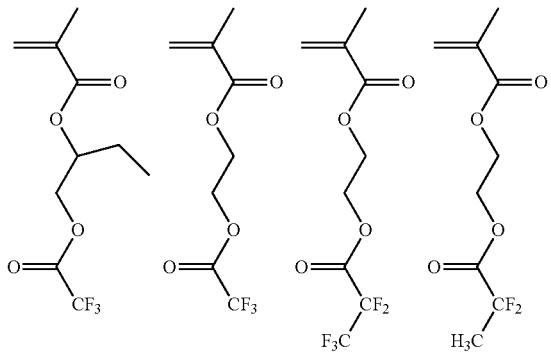

The base-labile polymer may include a repeating unit including two or more base-labile groups. For example, the base-labile polymer can include a repeating unit derived from a monomer of formula (E2)

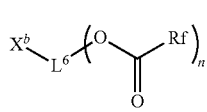
(E2)

wherein $X^b$ and $R^f$ are as defined in formula (E1); $L^6$ is a polyvalent linking group comprising one or more of substituted or unsubstituted straight chain or branched $C_{1-20}$ alkylene, substituted or unsubstituted $C_{3-20}$ cycloalkylene, —C(O)—, or —C(O)O—; and n is an integer of 2 or more, for example 2 or 3.

Exemplary monomers of formula (E2) include the following:

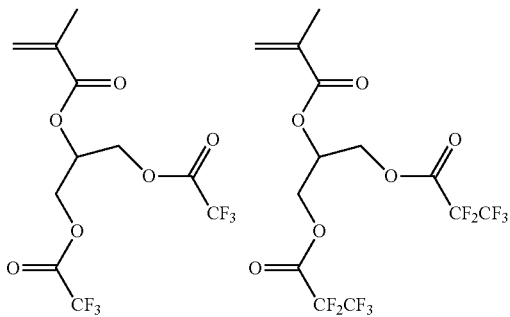

The base-labile polymer may include a repeating unit including one or more base-labile groups. For example, the base-labile polymer can include a repeating unit derived from a monomer of formula (E3):

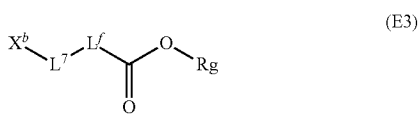
(E3)

wherein $X^b$ is as defined in formula (E1); $L^7$ is a divalent linking group comprising one or more of substituted or unsubstituted straight chain or branched $C_{1-20}$ alkylene, substituted or unsubstituted $C_{3-20}$ cycloalkylene, —C(O)—, or —C(O)O—; $L^f$ is substituted or unsubstituted $C_{1-20}$ fluoroalkylene group wherein the carbon atom bonded to the carbonyl (C=O) in formula (E1) is substituted with at least one fluorine atom; and $R^g$ is substituted or unsubstituted straight chain or branched $C_{1-20}$ alkyl, or substituted or unsubstituted $C_{3-20}$ cycloalkyl.

Exemplary monomers of formula (E3) include the following:

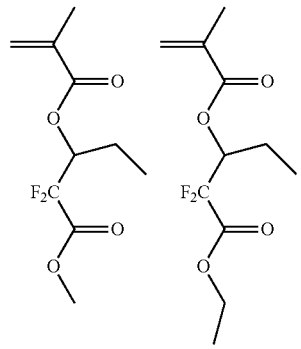

In a further preferred aspect of the invention, a base-labile polymer may comprise one or more base-labile groups and one or more acid-labile groups, such as one or more acid-labile ester moieties (e.g. t-butyl ester) or acid-labile acetal groups. For example, the base-labile polymer may comprise a repeating unit including a base-labile group and an acid-labile group, i.e., wherein both a base-labile group and an acid-labile group are present on the same repeating unit. In another example, the base-labile polymer may comprise a first repeating unit comprising a base-labile group and a second repeating unit comprising an acid-labile group. Preferred photoresists of the invention can exhibit reduced defects associated with a resist relief image formed from the photoresist composition.

The base-labile polymer may be prepared using any suitable methods in the art, including those described herein for the first and second polymers. For example, the base-labile polymer may be obtained by polymerization of the respective monomers under any suitable conditions, such as by heating at an effective temperature, irradiation with actinic radiation at an effective wavelength, or a combination thereof. Additionally, or alternatively, one or more base-labile groups may be grafted onto the backbone of a polymer using suitable methods.

The base-labile polymer typically has a $M_w$ from 1,000 to 50,000 Da, preferably from 2,000 to 30,000 Da, and more preferably from 3,000 to 20,000 Da, and still more preferably from 3,000 to 10,000 Da. The PDI of the polymer is typically from 1.1 to 3, and more typically from 1.1 to 2.0. Molecular weights are determined by GPC using polystyrene standards.

In some aspects, the base-labile material is a single molecule comprising one more base-labile ester groups, preferably one or more fluorinated ester groups. They base-labile materials that are non-polymeric may have a molecular weight in the range from 50 to 1,500 Da.

Exemplary base-labile materials include the following:

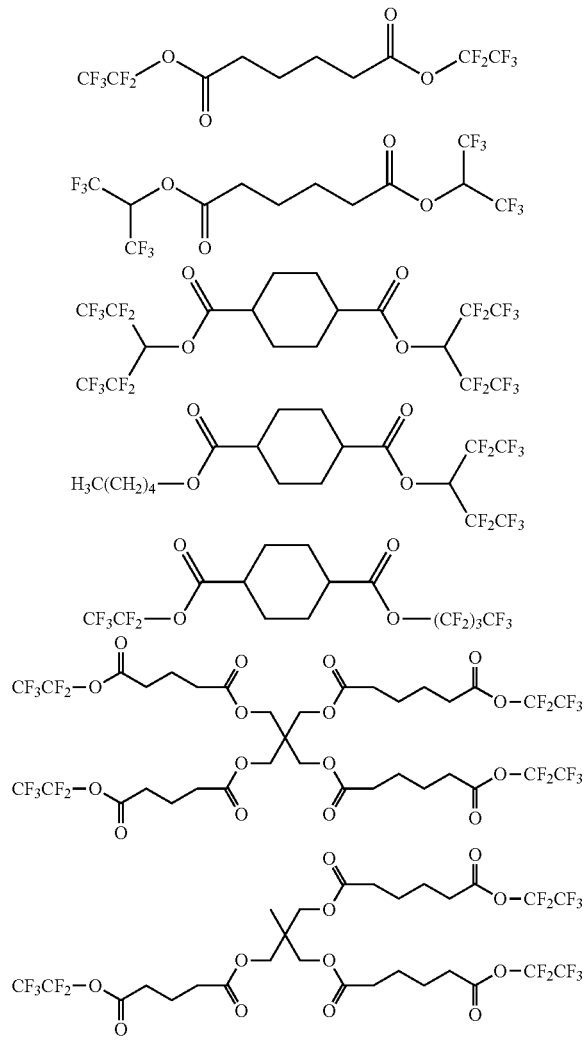

Additionally, or alternatively, to the base-labile polymer, the photoresist compositions may further include one or more polymers in addition to and different from the first and second polymers described above. For example, the photoresist compositions may include an additional polymer as described above but different in composition, or a polymer that is similar to those described above but does not include each of the requisite repeating units. Additionally, or alternatively, the one or more additional polymers may include those well known in the photoresist art, for example, those chosen from polyacrylates, polyvinylethers, polyesters, polynorbornenes, polyacetals, polyethylene glycols, polyamides, polyacrylamides, polyphenols, novolacs, styrenic polymers, polyvinyl alcohols, or combinations thereof.

The photoresist compositions further include a photoacid generator (PAG). The PAG can be in polymeric form, for example, present in a polymerized repeating unit of the first and/or second polymer as described above, or as part of a different polymer. Additionally, or alternatively, the PAG can be of non-polymeric form. Suitable non-polymerized photoacid generator compounds may have formula $G^+A^-$, wherein $G^+$ is of formula (3) as defined above, and $A^-$ is a non-polymerizable organic anion. Suitable non-polymerized PAGs are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; di-t-butyphenyliodonium perfluorobutanesulfonate, and di-t-butyphenyliodonium camphorsulfonate. Non-ionic sulfonates and sulfonyl compounds are also known to function as photoacid generators, e.g., nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxy succinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. Suitable non-polymerized photoacid generators are further described in U.S. Pat. No. 8,431,325 to Hashimoto et al. in column 37, lines 11-47 and columns 41-91. Other suitable sulfonate PAGS include sulfonated esters and sulfonyloxy ketones, nitrobenzyl esters, s-triazine derivatives, benzoin tosylate, t-butylphenyl α-(p-toluenesulfonyloxy)-acetate, and t-butyl α-(p-toluenesulfonyloxy)-acetate; as described in U.S. Pat. Nos. 4,189,323 and 8,431,325.

PAGs that are onium salts typically comprise an anion having a sulfonate group or a non-sulfonate type group, such as a sulfonamidate group, a sulfonimidate group, a methide group, or a borate group.

Exemplary anions having a sulfonate group include the following:

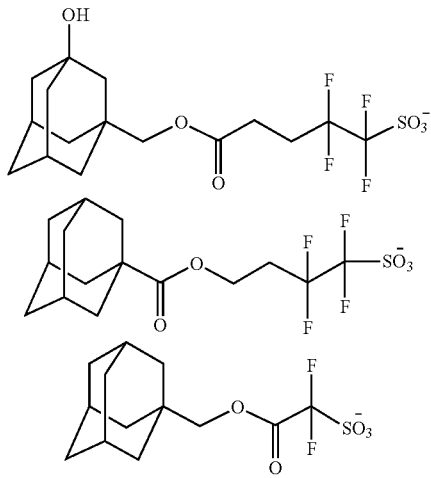

-continued
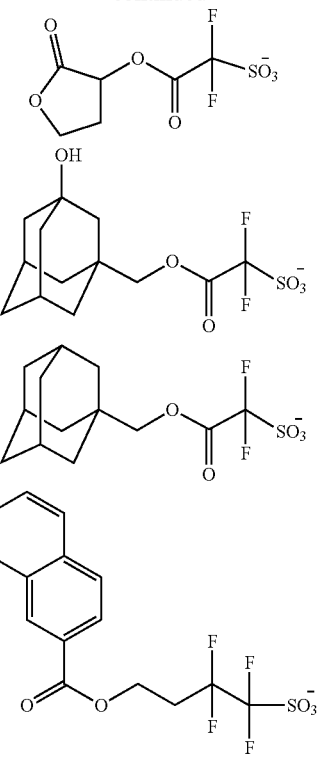
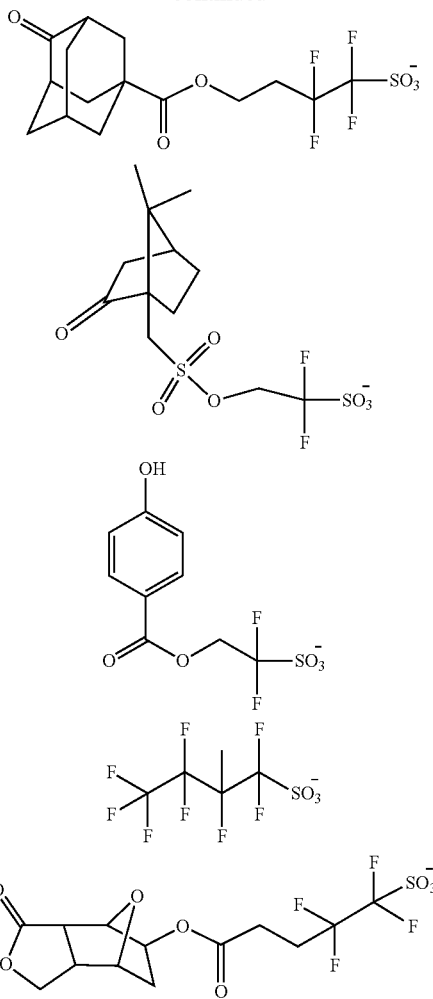
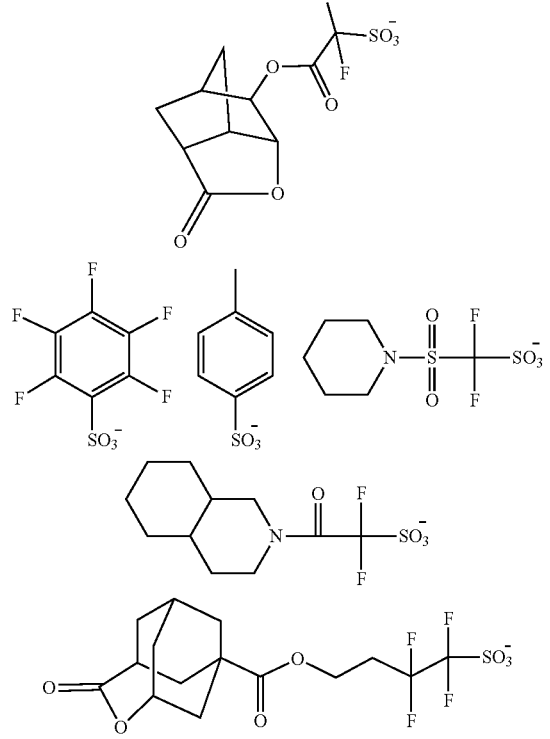

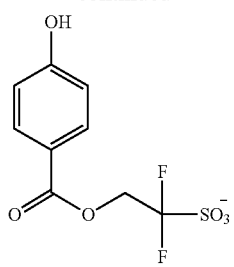

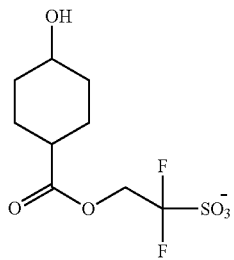

Exemplary non-sulfonated anions include the following:

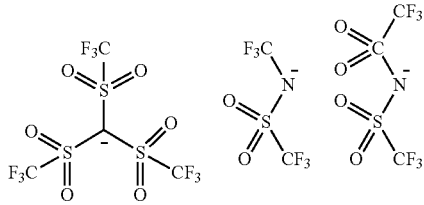

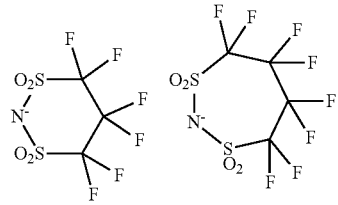

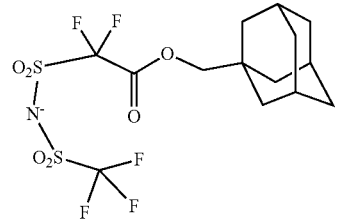

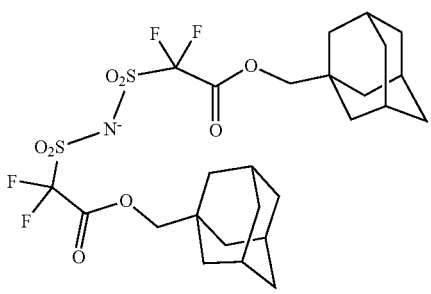

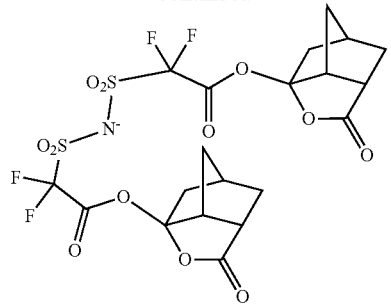

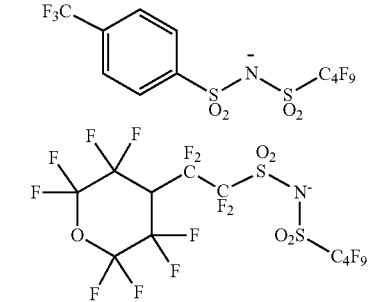

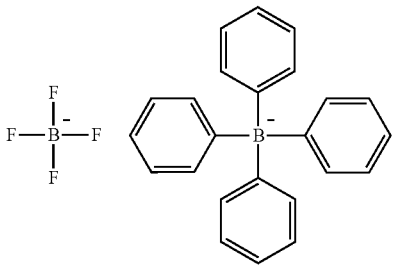

The photoresist composition may optionally comprise a plurality of PAGs. The plural PAGs may be polymeric, non-polymeric, or may include both polymeric and non-polymeric PAGs. Preferably, each of the plurality of PAGs is non-polymeric. Preferably, when a plurality of PAGs are used, a first PAG comprises a sulfonate group on the anion and a second PAG comprises an anion that is free of sulfonate groups, such anion containing for example, a sulfonamidate group, a sulfonimidate group, a methide group, or a borate group such as described above.

In one or more aspects, the photoresist composition may include a first photoacid generator that includes a sulfonate group on the anion, and the photoresist composition may include a second photoacid generator that is non-polymeric, wherein the second photoacid generator may include an anion that is free of sulfonate group.

Typically, the photoresist composition may include a non-polymerized photoacid generator in an amount from 5 to 65 wt %, and more typically from 5 to 55 wt %, based on total solids of the photoresist composition. In some embodiments, the photoresist composition may include two or more different non-polymerized photoacid generators in a combined amount from 5 to 65 wt %, and more typically from 5 to 55 wt %, based on total solids of the photoresist composition.

The photoresist compositions further include a solvent for dissolving the components of the composition and facilitating its coating on a substrate. Preferably, the solvent is an organic solvent conventionally used in the manufacture of electronic devices. Suitable solvents include, for example: aliphatic hydrocarbons such as hexane and heptane; aromatic hydrocarbons such as toluene and xylene; halogenated hydrocarbons such as dichloromethane, 1,2-dichloroethane and 1-chlorohexane; alcohols such as methanol, ethanol, 1-propanol, iso-propanol, tert-butanol, 2-methyl-2-butanol and 4-methyl-2-pentanol; propylene glycol monomethyl ether (PGME), ethers such as diethyl ether, tetrahydrofuran, 1,4-dioxane and anisole; ketones such as acetone, methyl ethyl ketone, methyl iso-butyl ketone, 2-heptanone and cyclohexanone (CHO); esters such as ethyl acetate, n-butyl acetate, propylene glycol monomethyl ether acetate (PGMEA), ethyl lactate (EL), hydroxyisobutyrate methyl ester (HBM) and ethyl acetoacetate; lactones such as gamma-butyrolactone (GBL) and epsilon-caprolactone; lactams such as N-methyl pyrrolidone; nitriles such as acetonitrile and propionitrile; cyclic or non-cyclic carbonate esters such as propylene carbonate, dimethyl carbonate, ethylene carbonate, propylene carbonate, diphenyl carbonate, and propylene carbonate; polar aprotic solvents such as dimethyl sulfoxide and dimethyl formamide; water; and combinations thereof. Of these, preferred solvents are PGME, PGMEA, EL, GBL, HBM, CHO, and combinations thereof. The total solvent content (i.e., cumulative solvent content for all solvents) in the photoresist compositions is typically from 40 to 99 wt %, for example, from 70 to 99 wt %, or from 85 to 99 wt %, based on total weight of the photoresist composition. The desired solvent content will depend, for example, on the desired thickness of the coated photoresist layer and coating conditions.

The photoresist composition may further include one or more additional, optional additives. For example, optional additives may include actinic and contrast dyes, anti-striation agents, plasticizers, speed enhancers, sensitizers, photodecomposable quenchers (also known as photo-decomposable bases), basic quenchers, surfactants, and the like, or combinations thereof. If present, the optional additives are typically present in the photoresist compositions in an amount from 0.01 to 10 wt %, based on total solids of the photoresist composition.

Photo-decomposable quenchers generate a weak acid upon irradiation. The acid generated from a photo-decomposable quencher is not strong enough to react rapidly with acid-labile groups that are present in the resist matrix. Exemplary photo-decomposable quenchers include, for example, photo-decomposable cations, and preferably those also useful for preparing strong acid generator compounds but paired with an anion of a weak acid (pKa>1) such as, for example, a $C_{1-20}$ carboxylic acid or $C_{1-20}$ sulfonic acid. Exemplary carboxylic acids include formic acid, acetic acid, propionic acid, tartaric acid, succinic acid, cyclohexanecarboxylic acid, benzoic acid, salicylic acid, and the like. Exemplary carboxylic acids include p-toluene sulfonic acid, camphor sulfonic acid and the like. In a preferred embodiment, the photo-decomposable quencher is a photo-decomposable organic zwitterion compound such as diphenyliodonium-2-carboxylate.

Exemplary basic quenchers include, for example: linear aliphatic amines such as tributylamine, trioctylamine, triisopropanolamine, tetrakis(2-hydroxypropyl)ethylenediamine. n-tert-butyldiethanolamine, tris(2-acetoxy-ethyl)amine, 2,2', 2",2"'-(ethane-1,2-diylbis(azanetriyl))tetraethanol, 2-(dibutylamino)ethanol, and 2,2',2"-nitrilotriethanol; cyclic aliphatic amines such as 1-(tert-butoxycarbonyl)-4-hydroxypiperidine, tert-butyl 1-pyrrolidinecarboxylate, tert-butyl 2-ethyl-1H-imidazole-1-carboxylate, di-tert-butyl piperazine-1,4-dicarboxylate, and N-(2-acetoxy-ethyl) morpholine; aromatic amines such as pyridine, di-tert-butyl pyridine, and pyridinium; linear and cyclic amides and derivatives thereof such as N,N-bis(2-hydroxyethyl)pivalamide, N,N-diethylacetamide, $N^1,N^1,N^3,N^3$-tetrabutylmalonamide, 1-methylazepan-2-one, 1-allylazepan-2-one, and tert-butyl 1,3-dihydroxy-2-(hydroxymethyl)propan-2-ylcarbamate; ammonium salts such as quaternary ammonium salts of sulfonates, sulfamates, carboxylates, and phosphonates; imines such as primary and secondary aldimines and ketimines; diazines such as optionally substituted pyrazine, piperazine, and phenazine; diazoles such as optionally substituted pyrazole, thiadiazole, and imidazole; and optionally substituted pyrrolidones such as 2-pyrrolidone and cyclohexyl pyrrolidine.

Exemplary surfactants include fluorinated and non-fluorinated surfactants and can be ionic or non-ionic, with non-ionic surfactants being preferable. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants from Omnova. In an aspect, the photoresist composition further includes a surfactant polymer including a fluorine-containing repeating unit.

Patterning methods using the photoresist compositions of the invention will now be described. Suitable substrates on which the photoresist compositions can be coated include electronic device substrates. A wide variety of electronic device substrates may be used in the present invention, such as: semiconductor wafers; polycrystalline silicon substrates; packaging substrates such as multichip modules; flat panel display substrates; substrates for light emitting diodes (LEDs) including organic light emitting diodes (OLEDs); and the like, with semiconductor wafers being typical. Such substrates are typically composed of one or more of silicon, polysilicon, silicon oxide, silicon nitride, silicon oxynitride, silicon germanium, gallium arsenide, aluminum, sapphire, tungsten, titanium, titanium-tungsten, nickel, copper, and gold. Suitable substrates may be in the form of wafers such as those used in the manufacture of integrated circuits, optical sensors, flat panel displays, integrated optical circuits, and LEDs. Such substrates may be any suitable size. Typical wafer substrate diameters are from 200 to 300 millimeters (mm), although wafers having smaller and larger diameters may be suitably employed according to the present invention. The substrates may include one or more layers or structures which may optionally include active or operable portions of devices being formed.

Typically, one or more lithographic layers such as a hardmask layer, for example, a spin-on-carbon (SOC), amorphous carbon, or metal hardmask layer, a CVD layer such as a silicon nitride (SiN), a silicon oxide (SiO), or silicon oxynitride (SiON) layer, an organic or inorganic underlayer, or combinations thereof, are provided on an upper surface of the substrate prior to coating a photoresist composition of the present invention. Such layers, together with an overcoated photoresist layer, form a lithographic material stack.

Optionally, a layer of an adhesion promoter may be applied to the substrate surface prior to coating the photoresist compositions. If an adhesion promoter is desired, any suitable adhesion promoter for polymer films may be used, such as silanes, typically organosilanes such as trimethoxyvinylsilane, triethoxyvinylsilane, hexamethyldisilazane, or an aminosilane coupler such as gamma-aminopropyltriethoxysilane. Particularly suitable adhesion promoters include those sold under the AP 3000, AP 8000, and AP 9000S designations, available from DuPont Electronics & Imaging (Marlborough, Massachusetts).

The photoresist composition may be coated on the substrate by any suitable method, including spin coating, spray coating, dip coating, doctor blading, or the like. For example, applying the layer of photoresist may be accomplished by spin coating the photoresist in solvent using a coating track, in which the photoresist is dispensed on a spinning wafer. During dispensing, the wafer is typically spun at a speed of up to 4,000 rotations per minute (rpm), for example, from 200 to 3,000 rpm, for example, 1,000 to 2,500 rpm, for a period of from 15 to 120 seconds to obtain a layer of the photoresist composition on the substrate. It will be appreciated by those skilled in the art that the thickness of the coated layer may be adjusted by changing the spin speed and/or the solids content of the composition. A photoresist layer formed from the compositions of the invention typically has a dried layer thickness of from 10 to 200 nanometers (nm), preferably from 15 to 100 nm, and more preferably from 20 to 60 nm The photoresist composition is typically next soft-baked to minimize the solvent content in the layer, thereby forming a tack-free coating and improving adhesion of the layer to the substrate. The soft bake is performed, for example, on a hotplate or in an oven, with a hotplate being typical. The soft bake temperature and time will depend, for example, on the particular photoresist composition and thickness. The soft bake temperature is typically from 90 to 170° C., for example, from 110 to 150° C. The soft bake time is typically from 10 seconds to 20 minutes, for example, from 1 minute to 10 minutes, or from 1 minute to 5 minutes. The heating time can be readily determined by one of ordinary skill in the art based on the ingredients of the composition.

The photoresist layer is next pattern-wise exposed to activating radiation to create a difference in solubility between exposed and unexposed regions. Reference herein to exposing a photoresist composition to radiation that is activating for the composition indicates that the radiation is capable of forming a latent image in the photoresist composition. The exposure is typically conducted through a patterned photomask that has optically transparent and optically opaque regions corresponding to regions of the resist layer to be exposed and unexposed, respectively. Such exposure may, alternatively, be conducted without a photomask in a direct writing method, typically used for e-beam lithography. The activating radiation typically has a wavelength of sub-400 nm, sub-300 nm or sub-200 nm, with 248 nm (KrF), 193 nm (ArF), and 13.5 nm (EUV) wavelengths, or e-beam lithography being preferred. The methods find use in immersion or dry (non-immersion) lithography techniques. The exposure energy is typically from 1 to 200 millijoules per square centimeter (mJ/cm$^2$), preferably from 10 to 100 mJ/cm$^2$, and more preferably from 20 to 50 mJ/cm$^2$, dependent upon the exposure tool and components of the photoresist composition.

Following exposure of the photoresist layer, a post-exposure bake (PEB) of the exposed photoresist layer is performed. The PEB can be conducted, for example, on a hotplate or in an oven, with a hotplate being typical. Conditions for the PEB will depend, for example, on the particular photoresist composition and layer thickness. The PEB is typically conducted at a temperature from 80 to 150° C., and a time from 30 to 120 seconds. A latent image defined by the polarity-switched (exposed regions) and unswitched regions (unexposed regions) is formed in the photoresist.

The exposed photoresist layer is then developed with a suitable developer to selectively remove those regions of the layer that are soluble in the developer while the remaining insoluble regions form the resulting photoresist pattern relief image. In the case of a positive-tone development (PTD) process, the exposed regions of the photoresist layer are removed during development and unexposed regions remain. Conversely, in a negative-tone development (NTD) process, the exposed regions of the photoresist layer remain, and unexposed regions are removed during development. Application of the developer may be accomplished by any suitable method such as described above with respect to application of the photoresist composition, with spin coating being typical. The development time is for a period effective to remove the soluble regions of the photoresist, with a time of from 5 to 60 seconds being typical. Development is typically conducted at room temperature.

Suitable developers for a PTD process include aqueous base developers, for example, quaternary ammonium hydroxide solutions such as tetramethylammonium hydroxide (TMAH), preferably 0.26 normal (N) TMAH, tetraethylammonium hydroxide, tetrabutylammonium hydroxide, sodium hydroxide, potassium hydroxide, sodium carbonate, potassium carbonate, and the like. Suitable developers for an NTD process are organic solvent-based, meaning the cumulative content of organic solvents in the developer is 50 wt % or more, typically 95 wt % or more, 95 wt % or more, 98 wt % or more, or 100 wt %, based on total weight of the developer. Suitable organic solvents for the NTD developer include, for example, those chosen from ketones, esters, ethers, hydrocarbons, and mixtures thereof. The developer is typically 2-heptanone or n-butyl acetate.

A coated substrate may be formed from the photoresist compositions of the invention. Such a coated substrate includes: (a) a substrate having one or more layers to be patterned on a surface thereof; and (b) a layer of the photoresist composition over the one or more layers to be patterned.

The photoresist pattern may be used, for example, as an etch mask, thereby allowing the pattern to be transferred to one or more sequentially underlying layers by known etching techniques, typically by dry-etching such as reactive ion etching. The photoresist pattern may, for example, be used for pattern transfer to an underlying hardmask layer which, in turn, is used as an etch mask for pattern transfer to one or more layers below the hardmask layer. If the photoresist pattern is not consumed during pattern transfer, it may be removed from the substrate by known techniques, for example, oxygen plasma ashing. The photoresist compositions may, when used in one or more such patterning processes, be used to fabricate semiconductor devices such as memory devices, processor chips (CPUs), graphics chips, optoelectronic chips, LEDs, OLEDs, as well as other electronic devices.

The invention is further illustrated by the following examples.

EXAMPLES

The chemical structures of polymers used in the examples and comparative examples are shown below. The preparation of polymers P2 and P3 is described in U.S. Pat. Pub. No. 2018/0284605. Polymers P1 and P4 to P8 were prepared using methods commonly available in the art.

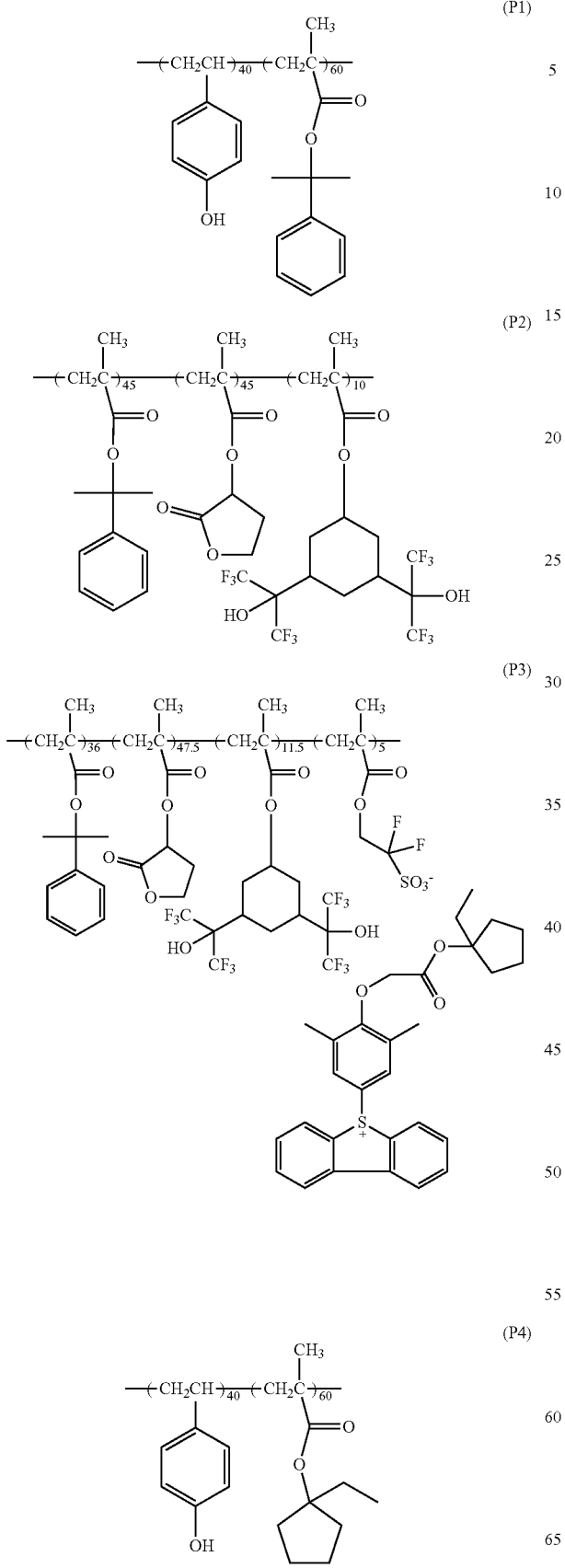
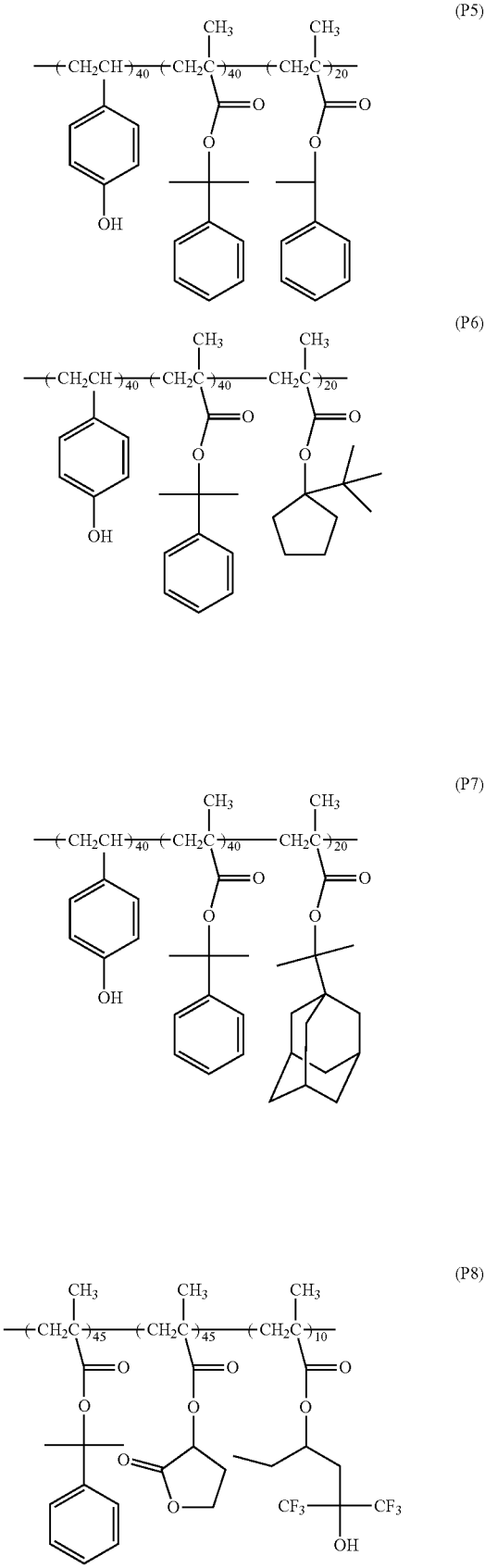

The chemical structures of photoactive compounds A1 to A5 used in examples are shown below.
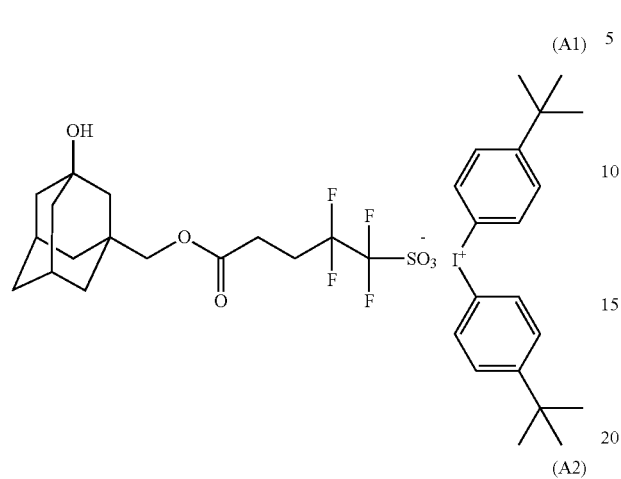
(A1)
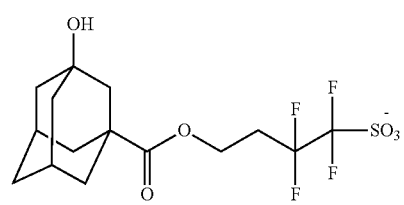
(A2)
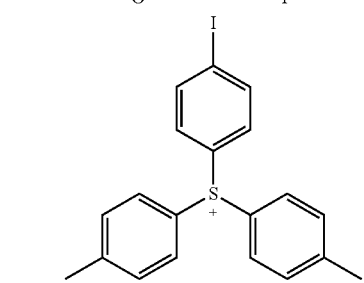
(A3)
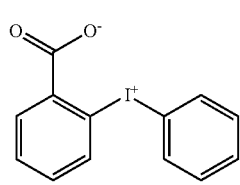
(A4)
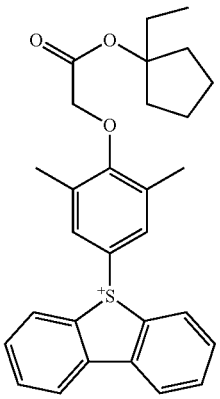
(A5)
The photoacid generator A1 was prepared by the one-step synthesis as shown in Scheme 1.
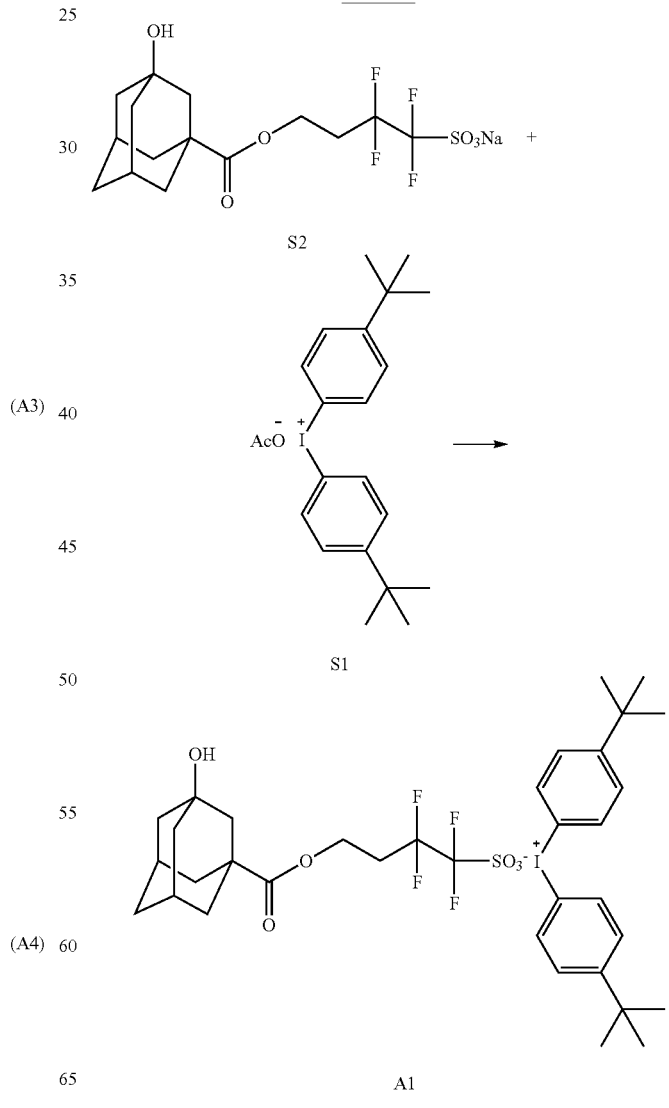
Scheme 1

To a mixture of S1 (20 g, 46.90 millimoles (mmol)) and S2 (20 g, 44.21 mmol) was added 125 milliliters (mL) of dichloromethane and 125 mL of deionized water. The mixture was stirred at room temperature for 6 hours (h). The organic phase was separated and washed with deionized water (5×150 mL). The organic phase was then separated and concentrated to about 50-60 mL and poured into methyl t-butyl ether (0.5 L). The product precipitated as a white solid. The product was filtered and dried under vacuum at 35° C. for 24 hours (h). Yield was 28 grams (g). Purity by UPLC was >98%.

The Photoacid generator A2 was prepared by the one-step synthesis as shown in Scheme 2.

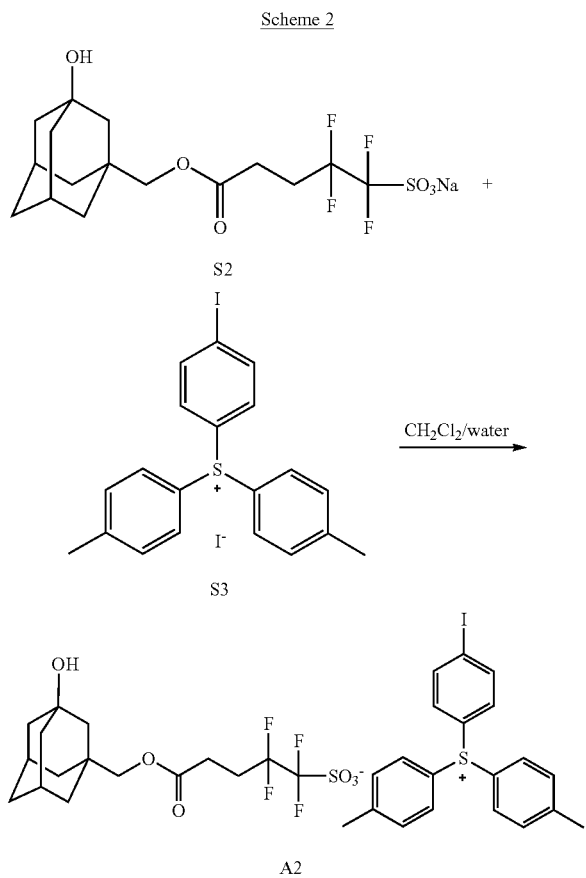

A mixture of S3 (10 g, 18.37 mmol) and S2 (8.50 g, 19.30 mmol) were combined in 125 mL of dichloromethane and 125 mL of deionized water. The mixture was stirred for 6 h at room temperature. The aqueous phase was separated, and the organic phase was washed with deionized water (5×100 mL). The organic solvent was removed under reduced pressure to give the crude product. The crude product was dissolved in 30 mL of acetone and poured into methyl t-butyl ether (500 mL) to obtain the product as a solid. The product was filtered and dried under vacuum at 35° C. for 24 h. Yield was 12.4 g. Purity by UPLC was >98%.

Photoactive compounds A3 and A4, organic base tri-n-octylamine (Q1), salicylic acid (O1), and base quenchers Q2 and Q3 were purchased from commercial sources and used as received.

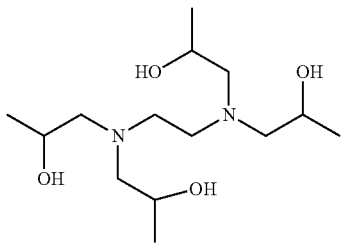

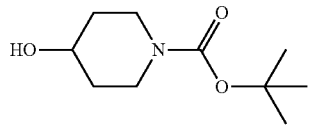

Example 1: Contrast Curve Measurements. Contrast curves at 248 nm were generated using a Canon ES2 scanner. The solvent of all compositions used in this example was a blend of 50/50 w/w of PGMEA and methyl 2-hydroxyisobutyrate. The total solids for each composition was 1.55 wt %. The resulting mixtures were shaken on a mechanical shaker and then filtered through a PTFE disk-shaped filter having a pores size of 0.2 micrometers. 200 mm silicon wafers overcoated with a BARC stack (a 60 nm thick AR™3 antireflectant over a 80 nm thick AR™40A antireflectant, DuPont Electronics & Imaging) were each spin-coated with a respective photoresist composition on a TEL Clean Track ACT 8 wafer track and softbaked at 110° C. for 90 seconds to provide a photoresist layer with a target thickness of about 40 nm. The resist was exposed with 248 nm radiation at an increasing dose from 5 to 50 mJ/cm$^2$, post exposure baked (PEB) at 110° C. for 60 seconds, and developed with a TMAH developer (MF™-CD26, DuPont Electronics & Imaging) for 60 seconds, rinsed with deionized water, and dried. Thickness was measured at each exposed area and plotted vs. dose. Dose-to-clear ($E_0$) was calculated at the point where remaining film thickness was less than 10% of the original coated thickness. An additional contrast curve for each wafer was generated by plotting normalized photoresist layer thickness in the exposed regions versus the log dose. Contrast (gamma, γ) was determined from the normalized contrast curve as the slope between the point of 80% and 20% photoresist film thickness. Unexposed film thickness loss (UFTL) was calculated by measuring the film thickness at 10 points on an unexposed photoresist film that was spin coated onto a cured BARC layer on top of a 200 mm silicon wafer, and calculating the difference between the coated film thickness and the average of those 10 points after rinsing with the 0.26 N TMAH solution.

Example 1A: The above described contrast curve method was used to measure the γ of comparative composition 1 which contained polymer P1 and comparative composition 2 which contained polymer P2. Inventive composition 3 contained a blend of polymers P1 and P2. Table 1 shows the compositions (amounts are in wt % of the composition), $E_0$, UFTL, and γ at 248 nm.

TABLE 1

| Composition | Polymer(s) | PAG | Additive | 248 nm $E_0$ (mJ/cm$^2$) | UFTL (Å) | γ |
|---|---|---|---|---|---|---|
| 1 (comparative) | [74.2] P1 | [24.3] A1 | [1.5] Q1 | 9.5 | 6.6 | 2.5 |
| 2 (comparative) | [74.2] P2 | [24.3] A1 | [1.5] Q1 | 15.5 | 6.8 | 1.7 |
| 3 | [18.6] P1 [55.6] P2 | [24.3] A1 | [1.5] Q1 | 15.5 | 6.4 | 5.4 |

As shown in Table 1, the γ for the inventive Composition 3 is significantly higher than for the comparative Compositions 1 and 2, and thus inventive Composition 3 is a higher contrast resist.

Example 1B: The above described contrast curve method was used to measure the contrast of comparative Composition 4 which contained polymer P3 and inventive Composition 5 which contained a blend of polymers P1 and P3. Table 2 shows the compositions (amounts are in wt % of the composition), $E_0$, UFTL, and γ at 248 nm.

TABLE 2

| Composition | Polymer(s) | PAG | Base | Additive | 248 nm $E_0$ (mJ/cm$^2$) | UFTL (Å) | γ |
|---|---|---|---|---|---|---|---|
| 4 (comparative) | [73.3] P3 | [24.1] A1 | [2.1] Q1 | [0.5] O1 | 17.0 | 7.8 | 0.9 |
| 5 | [55.0] P3 [18.3] P1 | [25.3] A1 | [2.1] Q1 | [0.5] O1 | 10.5 | 6.8 | 1.4 |

As shown in Table 2, the γ for the inventive Composition 5 is significantly higher than the γ for the comparative Composition 4, and thus inventive Composition 5 is a higher contrast resist.

Example 1C: The above described contrast curve method was used to measure the contrast of comparative Composition 6 which contained polymer P2, and comparative Composition 7 which contained polymer P1. Inventive Composition 8 contained a blend of polymers P1 and P2. Table 3 shows the compositions (amounts are in wt % of the composition), $E_0$, UFTL, and γ at 248 nm.

TABLE 3

| Composition | Polymer(s) | PAG | Base | Additive | 248 nm $E_0$ (mJ/cm$^2$) | UFTL (Å) | γ |
|---|---|---|---|---|---|---|---|
| 6 (comparative) | [72.4] P2 | [25.0] A2 | [2.1] Q1 | [0.5] O1 | 15.5 | 7.1 | 1.0 |
| 7 (comparative) | [72.4] P1 | [25.0] A2 | [2.1] Q1 | [0.5] O1 | 15.5 | 6.8 | 1.0 |
| 8 | [54.3] P2 [18.1] P1 | [25.0] A2 | [2.1] Q1 | [0.5] O1 | 14.5 | 6.8 | 1.4 |

As shown in Table 3, the γ for inventive Composition 8 is higher than the γ for the comparative Compositions 6 and 7, which indicates that inventive Composition 8 is a more digital or higher contrast resist, which is correlated to improved lithographic performance.

Example 1D: The above described contrast curve method was used to measure the contrast of comparative Composition 9 which contained polymer P2, and inventive Composition 10 which contained a blend of polymers P1 and P2. Table 4 shows the compositions (amounts are in wt % of the composition), $E_0$, UFTL, and γ at 248 nm.

TABLE 4

| Composition | Polymer(s) | PAG | Base | Additive | 248 nm $E_0$ (mJ/cm$^2$) | UFTL (Å) | γ |
|---|---|---|---|---|---|---|---|
| 9 (comparative) | [75.8] P2 | [21.6] A3 | [2.1] Q1 | [0.5] O1 | 11.0 | 6.8 | 1.4 |
| 10 | [56.8] P2 [19.0] P1 | [21.6] A3 | 2.1% Q1 | [0.5] A1 | 9.0 | 3.4 | 2.1 |

As shown in Table 4, the R γ for inventive Composition 10 is significantly higher than the γ for comparative Composition 9, which indicates inventive Composition 10 is a more digital or higher contrast resist, which is correlated to improved lithographic performance.

Example 1F: The above described contrast curve method was used to measure the contrast of comparative Composition 11 which contained polymer P2 and comparative Composition 12 which contained polymer P4, and inventive Composition 13 which contained a blend of polymers P2 and P4. Table 5 shows the compositions (amounts are in wt % of the composition), $E_0$, UFTL, and γ at 248 nm.

TABLE 5

| Composition | Polymer(s) | PAG | Base | Additive | 248 nm $E_0$ (mJ/cm$^2$) | UFTL (Å) | γ |
|---|---|---|---|---|---|---|---|
| 11 (comparative) | [61.7] P2 | [36.0] A3 | [1.7] Q1 | [0.6] O1 | 2.8 | 7.6 | 1.1 |
| 12 (comparative) | [61.7] P4 | [36.0] A3 | [1.7] Q1 | [0.6] O1 | 3.4 | 7.5 | 0.8 |
| 13 | [46.3] P2 [15.4] P4 | [36.0] A3 | [1.7] Q1 | [0.6] O1 | 3.1 | 7.9 | 1.4 |

As shown in Table 5, the γ for inventive Composition 13 is significantly higher than the γ for comparative Compositions 12 and 13, indicating that inventive Composition 13 ss a more digital or high contrast resist, which is correlated to improved lithographic performance.

Example 2: E-Beam Dense Line-Space Patterning. Coating resist compositions having the compositions shown in Tables 6 to 9 were prepared by combining the listed components in a 50/50 (w/w) mixture of PGMEA and methyl 2-hydroxyisobutyrate. The total solids for each composition was 1.55 wt %. Each resist composition was spin coated onto a cured organic bottom antireflective coating (BARC) layer on top of a 200 mm silicon wafer and baked at 110° C. for 90 s (to form a 40 nm thick photoresist film).

Lithographic patterning was performed using an electron-beam (E-beam) lithography tool (Model JEOL JBX9500FS) to print dense line-space (L/S) patterns at a ratio of 1:1 at different pitch sizes. After exposure, a post-exposure bake was performed at 100° C. for 60 s, followed by a 60 s development step with a 0.26 N TMAH solution. Scanning electron microscopy (SEM) was performed to collect images and analyze printed patterns. Line space patterns in nanometers (nm) were analyzed for critical dimension (CD), where sizing energy "$E_{size}$" is expressed in units of microcoulomb per square centimeter (μC/cm$^2$) and accounts for the irradiation energy when the line and space pattern of 1:1 having a specific half pitch was resolved. Line-width roughness (LWR) which is expressed in units of nanometers was determined by obtaining a 3-sigma value from the distribution of a total of 100 arbitrary points of line width measurements, followed by removing metrology noise (MetroLER software).

Example 2A: The above described dense line-space patterning and analysis methods were used to evaluate the lithographic performance of comparative Composition 14 which contained polymer P1, comparative Composition 15 which contained polymer P2, and inventive Composition 16 which contained a blend of polymers P1 and P2. Table 6 shows the compositions (amounts are in wt % of the composition), the $E_{size}$, and LWR results for 1:1 L/S pattern with a half pitch (HP) of 35 nm.

TABLE 6

| | | | | 35 nm HP L/S | |
|---|---|---|---|---|---|
| Composition | Polymer(s) | PAG | Additive | $E_{size}$ (μC/cm$^2$) | LWR (nm) |
| 14 (comparative) | [74.2] P1 | [24.3] A1 | [1.5] Q1 | 210 | 14.28 |
| 15 (comparative) | [74.2] P2 | [24.3] A1 | [1.5] Q1 | 210 | 5.0 |
| 16 | [18.6] P1 [55.6] P2 | [24.3] A1 | [1.5] Q1 | 210 | 4.78 |

As shown in Table 6, the inventive Composition 16 achieved a lower LWR compared to comparative Compositions 14 and 15.

Example 2B: The above-described dense line-space patterning and analysis methods were used to evaluate the lithographic performance of comparative Composition 17 which contained polymer P1, comparative Composition 18 which contained polymer P2, and inventive Composition 19 which contained a blend of polymers P1 and P2. Table 7 shows the compositions (amounts are in wt % of the composition), the $E_{size}$, and LWR results for 1:1 L/S pattern with a HP of 35 nm, 30 nm, and 25 nm.

TABLE 7

| Composition | Components | | $E_{size}$ (µC/cm²) 30 nm HP L/S | LWR (nm) | $E_{size}$ (µC/cm²) 35 nm HP L/S | LWR (nm) | 25 nm HP L/S |
|---|---|---|---|---|---|---|---|
| 17 (comparative) | Polymer PAG Base Additive | [73.3] P1 [24.1] A1 [2.1] Q1 [0.5] O1 | 190 | 4.82 | 150 | 4.90 | No resolution |
| 18 (comparative) | Polymer PAG Base Additive | [73.] P2 [24.1] A1 [2.1] Q1 [0.5] O1 | 170 | 4.83 | 130 | 4.90 | No resolution |
| 19 | Polymers Base Additive Copolymer/s | [18.3] P1 [55.0] P2 [24.1] A1 [2.1] Q1 [0.5] O1 | 210 | 4.55 | 190 | 4.45 | $E_{size}$ = 210 µC/cm² LWR = 6.47 nm |

As shown in Table 7, the inventive Composition 19 achieved a lower LWR at each printed CD compared to comparative Compositions 17 and 18.

Example 2C: The above-described dense line-space patterning and analysis methods were used to evaluate the lithographic performance of comparative Composition 20 which contained polymer P3, and inventive Composition 21 which contained a blend of polymers P1 and P2. Table 8 shows the compositions (amounts are in wt % of the composition), the $E_{size}$, and LWR results for 1:1 L/S pattern with a HP of 35 nm and 30 nm.

TABLE 8

| Composition | Components | | $E_{size}$ (µC/cm²) 30 nm HP LS | LWR (nm) | $E_{size}$ (µC/cm²) 35 nm HP LS | LWR (nm) |
|---|---|---|---|---|---|---|
| 20 (comparative) | Polymer PAG Base Additive | [73.3] P3 [24.1] A1 [2.1] Q1 [0.5] O1 | 130 | 9.96 | 110 | 8.23 |
| 21 | Polymers PAG Base Additive | [18.3] P1 [55.0] P2 [24.1] A1 [2.1] Q1 [0.5] O1 | 150 | 6.88 | 130 | 5.88 |

As shown in Table 8, the inventive Composition 21 achieved a lower LWR at each printed CD compared to comparative Composition 20.

Example 2D: The above described dense line-space patterning and analysis methods were used to evaluate the lithographic performance of comparative Composition 22 which contained polymer P1, and inventive Composition 23 which contained a blend of polymers P1 and P2. Table 9 shows the compositions (amounts are in wt % of the composition), the $E_{size}$, and LWR results for 1:1 L/S pattern with a HP of 35 nm.

TABLE 9

| Composition | Components | | $E_{size}$ (µC/cm²) 35 nm HP LS | LWR (nm) |
|---|---|---|---|---|
| 22 (comparative) | Polymer PAG Base Additive | [72.4] P1 [25.0] A2 [2.1] Q1 [0.5] O1 | 110 | 8.94 |
| 23 | Polymers | [18.1] P1 [54.3] P2 | 110 | 5.78 |

TABLE 9-continued

| Composition | Components | | $E_{size}$ (µC/cm²) 35 nm HP LS | LWR (nm) |
|---|---|---|---|---|
| | PAG Base Additive | [25.0] A2 [2.1] Q1 [0.5] O1 | | |

As shown in Table 9, the inventive Composition 23 achieved a lower LWR compared to comparative Composition 20.

Example 3: E-Beam Gridded Contact Hole (CH) Patterning. Coating resist compositions using the compositions shown in Tables 10 and 11 were formulated in a 50/50 (w/w) mixture of PGMEA and methyl 2-hydroxyisobutyrate. The total solids for each composition was 1.55 wt %. Each resist composition was spin coated onto a cured organic bottom antireflective coating (BARC) layer on top of a 200 mm silicon wafer and baked at 110° C. for 90 s to form a 40 nm thick photoresist film.

Lithographic patterning was performed using an electron-beam (E-beam) lithography tool (Model JEOL JBX9500FS) to print gridded contact hole (CH) patterns at varying pitches. After exposure, a post-exposure bake was performed at 100° C. for 60 s followed by a 60 s development step with 0.26 N TMAH solution. Scanning electron microscopy was performed to collect images and analyze printed patterns. Contact hole patterns were analyzed for critical dimension (CD) expressed in nm, sizing energy "$E_{size}$" expressed in units of microcoulomb per square centimeter (μC/cm$^2$) and critical dimension uniformity (CDU) which is expressed in nm was determined by measuring the CDs of 35 contact holes using a Fractilia MetroLER metrology tool in noise-filter mode.

Example 3A: The above described CH patterning and analysis methods were used to evaluate the lithographic performance of comparative Composition 24 which contained polymer P3, and inventive Composition 25 which contained a blend of polymers P1 and P3. Table 10 shows the compositions (amounts are in wt % of the composition), the E$_{size}$, and CDU results for 35 nm, 30 nm, and 25 nm holes.

and proportions set forth in Table 12 to a total solids content of 1.55 wt %. Wafers were spin-coated with a respective photoresist composition and softbaked at 110° C. for 90 seconds to provide a photoresist layer with a thickness of 40 nm. The photoresist-coated substrates were exposed to e-beam radiation with a JEOL Ltd. JBX-9500FS electron beam lithography system to print 35 nm diameter/70 nm pitch 1:1 contact hole patterns. The resists were post-exposure baked at 90° C. for 60 seconds, developed with TMAH developer (MF-CD26, DuPont Electronics & Imag-

TABLE 10

| Composition | Components | | 25 nm CH | | 30 nm CH | | 35 nm CH | |
|---|---|---|---|---|---|---|---|---|
| | | | E$_{size}$ (μC/cm$^2$) | CDU (nm) | E$_{size}$ (μC/cm$^2$) | CDU (nm) | E$_{size}$ (μC/cm$^2$) | CDU (nm) |
| 24 (comparative) | Polymer | [73.3] P3 | 170 | 21.23 | 190 | 20.86 | — | 12.44 |
| | PAG | [24.1] A1 | | | | | | |
| | Base | [2.1] Q1 | | | | | | |
| | Additive | [0.5] O1 | | | | | | |
| 25 | Polymers | [18.3] P1 | 170 | 7.67 | 190 | 10.43 | 150 | 4.92 |
| | | [55.0] P3 | | | | | | |
| | PAG | [24.1] A1 | | | | | | |
| | Base | [2.1] Q1 | | | | | | |
| | Additive | [0.5] O1 | | | | | | |

As shown in Table 10, the inventive Composition 25 achieved a lower CDU at each printed CD compared to comparative Composition 24.

Example 3B: The above described CH patterning and analysis methods were used to evaluate the lithographic performance of comparative Composition 26 which contained polymer P1, and inventive Composition 27 which contained a blend of polymers P1 and P2. Table 11 shows the compositions (amounts are in wt % of the composition), the E$_{size}$ and CDU results for 35 nm, 30 nm, and 25 nm holes.

ing) for 45 seconds, rinsed with deionized water, and dried. Scanning electron microscopy was performed to collect images and analyze printed patterns. CD measurements of the contact hole patterns were made based on the SEM images using Fractilia MetroLER metrology software. Sizing energy (E$_{size}$) and CD uniformity (3G) (CDU) were determined based on the measurements. The sizing energy is the irradiation energy at which the target 35 nm diameter contact hole pattern was resolved. CDU was determined

TABLE 11

| Composition | Components | | 25 nm CH | | 30 nm CH | | 35 nm CH | |
|---|---|---|---|---|---|---|---|---|
| | | | E$_{size}$ (μC/cm$^2$) | CDU (nm) | E$_{size}$ (μC/cm$^2$) | CDU (nm) | E$_{size}$ (μC/cm$^2$) | CDU (nm) |
| 26 (comparative) | Polymer | [72.4] P1 | 170 | 8.69 | 190 | 9.3 | 130 | 14.3 |
| | PAG | [25.0] A2 | | | | | | |
| | Base | [2.1] Q1 | | | | | | |
| | Additive | [0.5] O1 | | | | | | |
| 27 | Polymers | [18.1] P1 | 170 | 7.56 | 170 | 5.35 | 170 | 4.3 |
| | | [54.3] P2 | | | | | | |
| | PAG | [25.0] A2 | | | | | | |
| | Base | [2.1] Q1 | | | | | | |
| | Additive | [0.5] O1 | | | | | | |

As shown in Table 11, the inventive Composition 27 achieved a lower CDU at each printed CD compared to comparative Composition 26.

Example 4B: Photoresist compositions were prepared by dissolving solid components in solvents using the materials based on CDs of 35 contact holes. Table 12 shows the compositions (amounts are in wt % based on total solids in a 1:1 mixture of solvents 51 and S2), E$_{size}$ (μC/cm$^2$), and CDU (nm). 51 is propylene glycol monomethyl ether acetate, S2=methyl 2-hydroxyisobutyrate.

TABLE 12

| Photoresist Composition | Polymer | PAG | Base 1 | Base 2 | Solvent | E$_{size}$ (μC/cm$^2$) | CDU (nm) |
|---|---|---|---|---|---|---|---|
| 26 | P5 [50] P2 [50] | A1 [25] | Q2 [0.6] | | S1/S2 | 270 | 1.3 |
| 27 | P6 [50] P2 [50] | A1 [25.5] | Q2 [0.6] | | S1/S2 | 240 | 1.2 |

TABLE 12-continued

| Photoresist Composition | Polymer | PAG | Base 1 | Base 2 | Solvent | $E_{size}$ ($\mu C/cm^2$) | CDU (nm) |
|---|---|---|---|---|---|---|---|
| 28 | P7 [50] P2 [50] | A1 [25] | A4 [2] | | | 220 | 1.1 |
| 29 | P8 [50] P1 [50] | A1 [12.60] A5 [13.66] | A4 [1.6] | Q3 [0.6] | | 290 | 1.6 |

As shown in Table 12, inventive Composition 26 to 29 achieved remarkably low CDU in the range from 1.1 to 1.6 which is desirable for electronic devices.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A photoresist composition comprising:
a first polymer comprising a first repeating unit comprising a hydroxy-aryl group and a second repeating unit comprising an acid-labile group, wherein the first repeating unit is present in the first polymer in an amount from 30 to 50 mol %, based on total repeating units in the first polymer;
a second polymer comprising a first repeating unit comprising an acid-labile group, a second repeating unit comprising a lactone group, and a third repeating unit comprising a base-soluble group, wherein the base-soluble group has a pKa of less than or equal to 12, and wherein the base-soluble group does not comprise a hydroxy-aryl group;
a photoacid generator; and
a solvent,
wherein the first polymer and the second polymer are different from each other,
wherein the first polymer and the second polymer are present in a weight ratio from 1:2 to 1:4, and
wherein the second repeating unit of the first polymer is derived from a monomer of formula (2a'), (2b'), (2c'), (2d'), or (2e'):

(2a')

(2b')

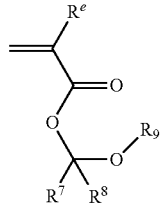
(2c')

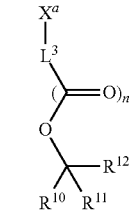
(2d')

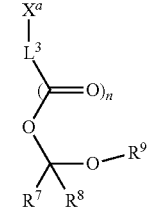
(2e')

wherein, in formulae (2a'), (2b'), (2c'), (2d'), or (2e'),
$R^c$, $R^d$, and $R^e$ are each independently hydrogen, fluorine, cyano, substituted or unsubstituted $C_{1-10}$ alkyl, or substituted or unsubstituted $C_{1-10}$ fluoroalkyl;
$R^1$ to $R^6$ are each independently hydrogen, substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{2-20}$ alkenyl, substituted or unsubstituted $C_{3-20}$ cycloalkenyl, substituted or unsubstituted $C_{3-20}$ heterocycloalkenyl, substituted or unsubstituted $C_{6-20}$ aryl, or substituted or unsubstituted $C_{4-20}$ heteroaryl;
provided that only one of $R^1$ to $R^3$ can be hydrogen and only one of $R^4$ to $R^6$ can be hydrogen;
any two of $R^1$ to $R^3$ together optionally form a ring, and each of $R^1$ to $R^3$ optionally may include as part of their structure one or more groups selected from —O—, —C(O)—, —N($R^{42}$)—, —S—, or —S(O)$_2$—, wherein $R^{42}$ is hydrogen, a straight chain or branched $C_{1-20}$ alkyl, monocyclic or polycyclic $C_{3-20}$ cycloalkyl, or monocyclic or polycyclic $C_{3-20}$ heterocycloalkyl;
any two of $R^4$ to $R^6$ together optionally form a ring, and each of $R^4$ to $R^6$ optionally may include as part of their structure one or more groups selected from —O—, —C(O)—, —N($R^{43}$)—, —S—, or —S(O)$_2$—, wherein $R^{43}$ is hydrogen, a straight chain or branched $C_{1-20}$ alkyl, monocyclic or polycyclic $C_{3-20}$ cycloalkyl, or monocyclic or polycyclic $C_{3-20}$ heterocycloalkyl;

L² is a divalent linking;

R⁷ to R⁸ are each independently hydrogen, substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{6-20}$ aryl, or substituted or unsubstituted $C_{4-20}$ heteroaryl, R⁹ is substituted or unsubstituted $C_{1-20}$ alkyl, substituted or unsubstituted $C_{3-20}$ cycloalkyl, or substituted or unsubstituted $C_{3-20}$ heterocycloalkyl, wherein one of R⁷ or R⁸ optionally forms a heterocyclic ring together with R⁹;

R¹⁰ to R¹² are each independently substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{6-20}$ aryl, or substituted or unsubstituted $C_{4-20}$ heteroaryl;

any two of R¹⁰ to R¹² together optionally form a ring, and each of R¹⁰ to R¹² optionally comprise as part of their structure one or more groups selected from —O—, —C(O)—, —N(R⁴⁴)—, —S—, or —S(O)₂—, wherein R⁴⁴ is hydrogen, straight chain or branched $C_{1-20}$ alkyl, monocyclic or polycyclic $C_{3-20}$ cycloalkyl, or monocyclic or polycyclic $C_{3-20}$ heterocycloalkyl;

Xᵃ is a polymerizable group selected from norbornyl or vinyl;

n is 1; and

L³ is a single bond or a divalent linking group, provided that L³ is not a single bond when Xᵃ is vinyl.

2. The photoresist composition of claim 1, wherein the first repeating unit of the first polymer is of formula (1a):

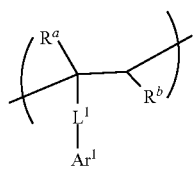
(1a)

wherein,
Rᵃ is hydrogen, halogen, cyano, substituted or unsubstituted $C_{1-10}$ alkyl, or substituted or unsubstituted $C_{1-10}$ fluoroalkyl;

Rᵇ is hydrogen, —C(O)— forming a ring with L¹, or a single bond forming a ring with Ar¹;

L¹ is a single bond or a divalent linking group comprising one or more of substituted or unsubstituted $C_{1-30}$ alkylene, substituted or unsubstituted $C_{3-30}$ cycloalkylene, substituted or unsubstituted $C_{1-30}$ heterocycloalkylene, substituted or unsubstituted $C_{6-30}$ arylene, substituted or unsubstituted divalent $C_{7-30}$ arylalkyl, substituted or unsubstituted $C_{1-30}$ heteroarylene, or substituted or unsubstituted divalent $C_{3-30}$ heteroarylalkyl, —O—, —C(O)—, —C(O)—O—, —C(O)—N(R²ᵃ)—, —S—, —S(O)₂—, —N(R²ᵃ)—S(O)₂—, —C_{1-12} hydrocarbylene-, —O—(C_{1-12} hydrocarbylene)—, —C(O)—O—(C_{1-12} hydrocarbylene)-, or —C(O)—O—(C_{1-12} hydrocarbylene)—O—, wherein R²ᵃ is hydrogen, $C_{1-6}$ alkyl, or a single bond forming the ring with Rᵇ;

provided that Rᵇ is —C(O)— forming the ring with L¹ when R²ᵃ is the single bond forming the ring with Rᵇ;

Ar¹ comprises a hydroxy-substituted $C_{6-60}$ aryl group, a hydroxy-substituted $C_{5-60}$ heteroaryl group, or a combination thereof, each optionally further substituted with one or more of substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{1-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl, —OR²¹, or —NR²²R²³, wherein R²¹ to R²³ are each independently substituted or unsubstituted $C_{1-30}$ alkyl, substituted or unsubstituted $C_{3-30}$ cycloalkyl, substituted or unsubstituted $C_{2-30}$ heterocycloalkyl, substituted or unsubstituted $C_{6-30}$ aryl, substituted or unsubstituted $C_{7-30}$ arylalkyl, substituted or unsubstituted $C_{3-30}$ heteroaryl, or substituted or unsubstituted $C_{4-30}$ heteroarylalkyl.

3. The photoresist composition of claim 1, wherein the first repeating unit of the second polymer is derived from a monomer of formula (2a), (2b), (2c), (2d), or (2e):

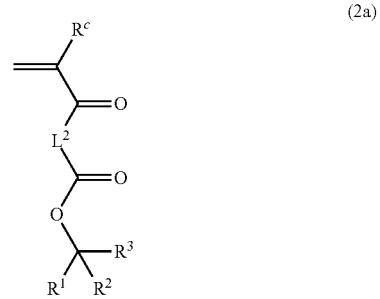
(2a)

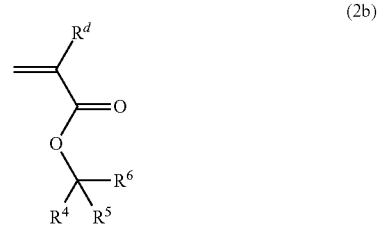
(2b)

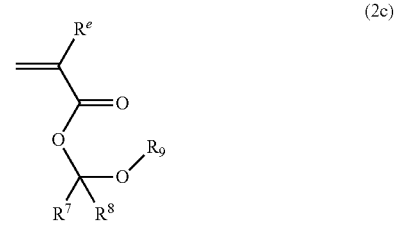
(2c)

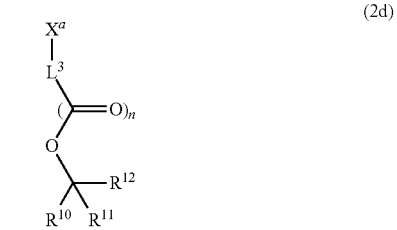
(2d)

-continued

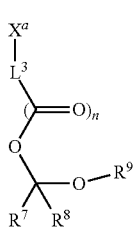
(2e)

wherein, $R^c$, $R^d$, and $R^e$ are each independently hydrogen, fluorine, cyano, substituted or unsubstituted $C_{1-10}$ alkyl, or substituted or unsubstituted $C_{1-10}$ fluoroalkyl;

$R^1$ to $R^6$ are each independently hydrogen, substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{2-20}$ alkenyl, substituted or unsubstituted $C_{3-20}$ cycloalkenyl, substituted or unsubstituted $C_{3-20}$ heterocycloalkenyl, substituted or unsubstituted $C_{6-20}$ aryl, or substituted or unsubstituted $C_{4-20}$ heteroaryl;

provided that only one of $R^1$ to $R^3$ can be hydrogen and only one of $R^4$ to $R^6$ can be hydrogen;

any two of $R^1$ to $R^3$ together optionally form a ring, and each of $R^1$ to $R^3$ optionally may include as part of their structure one or more groups selected from —O—, —C(O)—, —N($R^{42}$)—, —S—, or —S(O)$_2$—, wherein $R^{42}$ is hydrogen, a straight chain or branched $C_{1-20}$ alkyl, monocyclic or polycyclic $C_{3-20}$ cycloalkyl, or monocyclic or polycyclic $C_{3-20}$ heterocycloalkyl;

any two of $R^4$ to $R^e$ together optionally form a ring, and each of $R^4$ to $R^6$ optionally may include as part of their structure one or more groups selected from —O—, —C(O)—, —N($R^{43}$)—, —S—, or —S(O)$_2$—, wherein $R^{43}$ is hydrogen, a straight chain or branched $C_{1-20}$ alkyl, monocyclic or polycyclic $C_{3-20}$ cycloalkyl, or monocyclic or polycyclic $C_{3-20}$ heterocycloalkyl;

$L^2$ is a divalent linking;

$R^7$ to $R^8$ are each independently hydrogen, substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{6-20}$ aryl, or substituted or unsubstituted $C_{4-20}$ heteroaryl;

$R^9$ is substituted or unsubstituted $C_{1-20}$ alkyl, substituted or unsubstituted $C_{3-20}$ cycloalkyl, or substituted or unsubstituted $C_{3-20}$ heterocycloalkyl, wherein one of $R^7$ or $R^8$ optionally forms a heterocyclic ring together with $R^9$;

$R^{10}$ to $R^{12}$ are each independently substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{6-20}$ aryl, or substituted or unsubstituted $C_{4-20}$ heteroaryl;

any two of $R^{10}$ to $R^{12}$ together optionally form a ring, and each of $R^{10}$ to $R^{12}$ optionally comprise as part of their structure one or more groups selected from —O—, —C(O)—, —N($R^{44}$)—, —S—, or —S(O)$_2$—, wherein $R^{44}$ is hydrogen, straight chain or branched $C_{1-20}$ alkyl, monocyclic or polycyclic $C_{3-20}$ cycloalkyl, or monocyclic or polycyclic $C_{3-20}$ heterocycloalkyl;

$X^a$ is a polymerizable group selected from norbornyl or vinyl;

n is 0 or 1; and $L^3$ is a single bond or a divalent linking group, provided that $L^3$ is not a single bond when $X^a$ is vinyl.

4. The photoresist composition of claim 1, wherein the second repeating unit of the second polymer is derived from a monomer of formula (4), and the third repeating unit of the second polymer is derived from a monomer of formula (5):

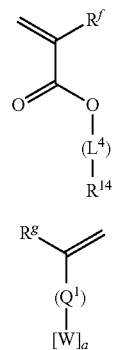

(4)

(5)

wherein, in Formulae (4) and (5), $R^f$ and $R^g$ are each independently hydrogen, fluorine, cyano, substituted or unsubstituted $C_{1-10}$ alkyl, or substituted or unsubstituted $C_{1-10}$ fluoroalkyl;

$L^4$ is a single bond or a divalent linking group;

$R^{44}$ is hydrogen, a straight chain or branched $C_{1-20}$ alkyl, monocyclic or polycyclic $C_{3-20}$ cycloalkyl, or monocyclic or polycyclic $C_{3-20}$ heterocycloalkyl;

$R^{14}$ is a monocyclic, polycyclic, or fused polycyclic $C_{4-20}$ lactone-containing group;

$Q^1$ is one or more of substituted or unsubstituted $C_{1-30}$ alkylene, substituted or unsubstituted $C_{3-30}$ cycloalkylene, substituted or unsubstituted $C_{1-30}$ heterocycloalkylene, substituted or unsubstituted $C_{6-30}$ arylene, substituted or unsubstituted divalent $C_{7-30}$ arylalkyl, substituted or unsubstituted $C_{1-30}$ heteroarylene, or substituted or unsubstituted divalent $C_{3-30}$ heteroarylalkyl, or —C(O)—O—;

W is the base-soluble group comprising —C(O)—OH; —C(CF$_3$)$_2$OH; an amide; an imide; or —NH—S(O)$_2$—Y$^1$ wherein Y$^1$ is F or $C_{1-4}$ perfluoroalkyl; and a is an integer of 1 to 3.

5. The photoresist composition of claim 4, wherein the third repeating unit of the second polymer is derived from a monomer chosen from the following:

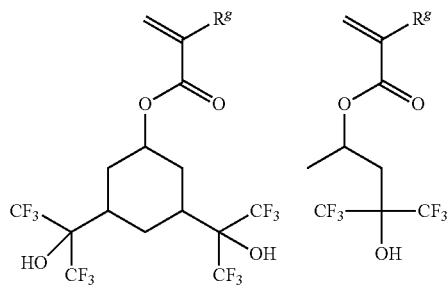

-continued

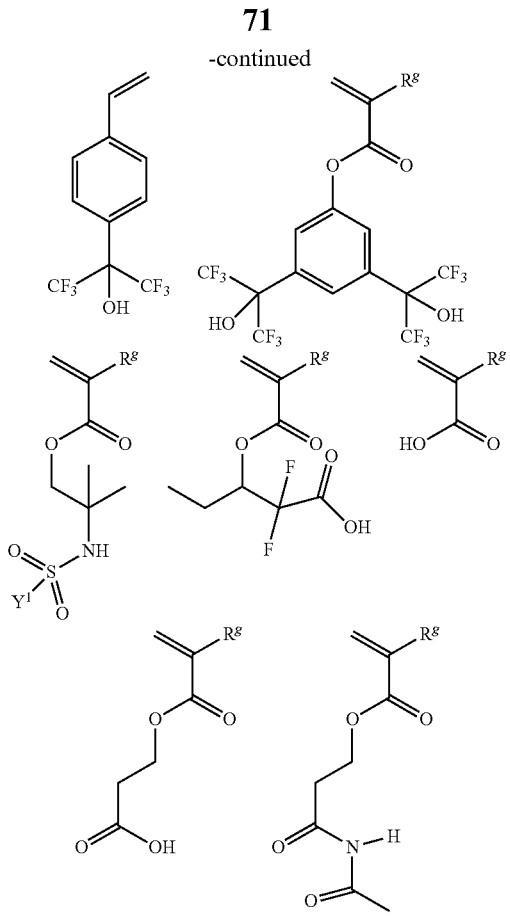

wherein,
R$^g$ is hydrogen, fluorine, cyano, substituted or unsubstituted C$_{1-10}$ alkyl, or substituted or unsubstituted C$_{1-10}$ fluoroalkyl; and
Y$^1$ is F or C$_{1-4}$ perfluoroalkyl.

6. The photoresist composition of claim 4, wherein the third repeating unit of the second polymer is derived from a monomer chosen from the following:

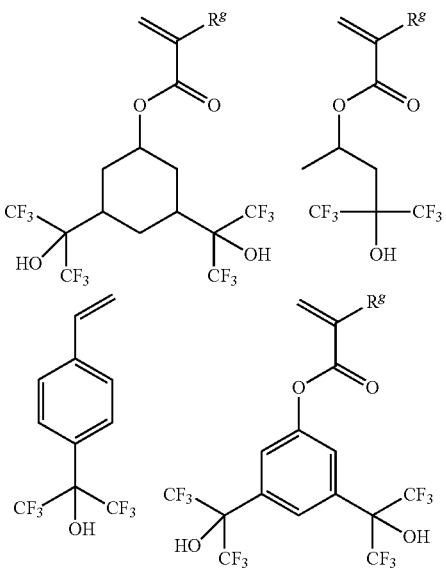

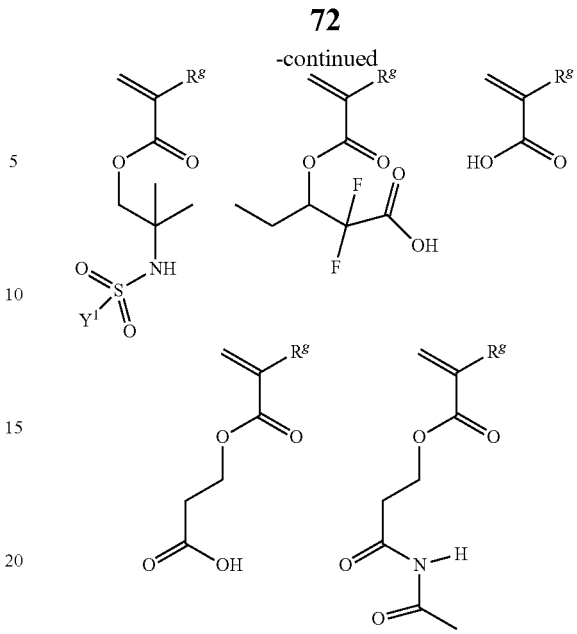

wherein,
R$^g$ is hydrogen, fluorine, cyano, substituted or unsubstituted C$_{1-10}$ alkyl, or substituted or unsubstituted C$_{1-10}$ fluoroalkyl; and
Y$^1$ is F or C$_{1-4}$ perfluoroalkyl.

7. The photoresist composition of claim 1, wherein the first polymer or the second polymer comprises a repeating unit comprising the photoacid generator.

8. The photoresist composition of claim 7, further comprising a non-polymeric photoacid generator.

9. The photoresist composition of claim 1, further comprising a photo-decomposable quencher.

10. The photoresist composition of claim 1, further comprising a base-labile material comprising one or more base-labile groups, wherein the base-labile material is different from the first polymer and the second polymer.

11. A pattern formation method, comprising:
(a) applying a layer of a photoresist composition of claim 1 on a substrate;
(b) pattern-wise exposing the photoresist composition layer to activating radiation; and
(c) developing the exposed photoresist composition layer to provide a resist relief image.

12. The method of claim 11, wherein the first repeating unit of the first polymer is of formula (1a):

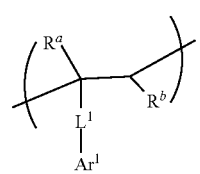

(1a)

wherein,
R$^a$ is hydrogen, halogen, cyano, substituted or unsubstituted C$_{1-10}$ alkyl, or substituted or unsubstituted C$_{1-10}$ fluoroalkyl;
R$^b$ is hydrogen, —C(O)— forming a ring with L$^1$, or a single bond forming a ring with Ar$^1$;
L$^1$ is a single bond or a divalent linking group comprising one or more of substituted or unsubstituted C$_{1-30}$ alkylene, substituted or unsubstituted $C_{3-30}$ cycloalkylene, substituted or unsubstituted $C_{1-30}$ heterocycloalkylene, substituted or unsubstituted $C_{6-30}$ arylene, substituted or unsubstituted divalent $C_{7-30}$ arylalkyl, substituted or unsubstituted $C_{1-30}$ heteroarylene, or substituted or unsubstituted divalent $C_{3-30}$ heteroarylalkyl, —O—, —C(O)—, —C(O)—O—, —C(O)—N($R^{2a}$)—, —S—, —S(O)$_2$—, —N($R^{2a}$)—S(O)$_2$—, —$C_{1-12}$ hydrocarbylene-, —O—($C_{1-12}$ hydrocarbylene)-, —C(O)—O—($C_{1-12}$ hydrocarbylene)-, or —C(O)—O—($C_{1-12}$ hydrocarbylene)—O—, wherein $R^{2a}$ is hydrogen, $C_{1-6}$ alkyl, or a single bond forming the ring with $R^b$;

provided that $R^b$ is —C(O)— forming the ring with $L^1$ when $R^{2a}$ is the single bond forming the ring with $R^b$;

$Ar^1$ comprises a hydroxy-substituted $C_{6-60}$ aryl group, a hydroxy-substituted $C_{5-60}$ heteroaryl group, or a combination thereof, each optionally further substituted with one or more of substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{1-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{3-30}$ heteroaryl, or substituted or unsubstituted $C_{4-30}$ heteroarylalkyl, —$OR^{21}$, or —$NR^{22}R^{23}$, wherein $R^{21}$ to $R^{23}$ are each independently substituted or unsubstituted $C_{1-30}$ alkyl, substituted or unsubstituted $C_{3-30}$ cycloalkyl, substituted or unsubstituted $C_{2-30}$ heterocycloalkyl, substituted or unsubstituted $C_{6-30}$ aryl, substituted or unsubstituted $C_{7-30}$ arylalkyl, substituted or unsubstituted $C_{3-30}$ heteroaryl, or substituted or unsubstituted $C_{4-30}$ heteroarylalkyl.

13. The method of claim 11, wherein the first repeating unit of the second polymer are each independently derived from a monomer of formula (2a), (2b), (2c), (2d), or (2e):

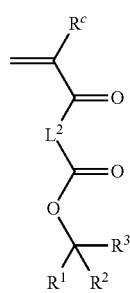
(2a)

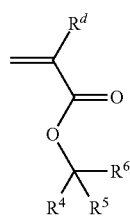
(2b)

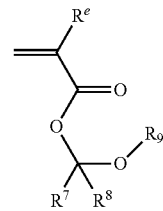
(2c)

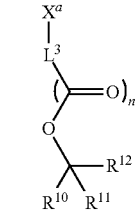
(2d)

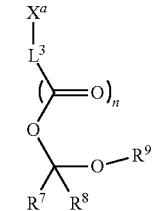
(2e)

wherein, $R^c$, $R^d$, and $R^e$ are each independently hydrogen, fluorine, cyano, substituted or unsubstituted $C_{1-10}$ alkyl, or substituted or unsubstituted $C_{1-10}$ fluoroalkyl;

$R^1$ to $R^6$ are each independently hydrogen, substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{2-20}$ alkenyl, substituted or unsubstituted $C_{3-20}$ cycloalkenyl, substituted or unsubstituted $C_{3-20}$ heterocycloalkenyl, substituted or unsubstituted $C_{6-20}$ aryl, or substituted or unsubstituted $C_{4-20}$ heteroaryl;

provided that only one of $R^1$ to $R^3$ can be hydrogen and only one of $R^4$ to $R^6$ can be hydrogen;

any two of $R^1$ to $R^3$ together optionally form a ring, and each of $R^1$ to $R^3$ optionally may include as part of their structure one or more groups selected from —O—, —C(O)—, —N($R^{42}$)—, —S—, or —S(O)$_2$—, wherein $R^{42}$ is hydrogen, a straight chain or branched $C_{1-20}$ alkyl, monocyclic or polycyclic $C_{3-20}$ cycloalkyl, or monocyclic or polycyclic $C_{3-20}$ heterocycloalkyl;

any two of $R^4$ to $R^6$ together optionally form a ring, and each of $R^4$ to $R^6$ optionally may include as part of their structure one or more groups selected from —O—, —C(O)—, —N($R^{43}$)—, —S—, or —S(O)$_2$—, wherein $R^{43}$ is hydrogen, a straight chain or branched $C_{1-20}$ alkyl, monocyclic or polycyclic $C_{3-20}$ cycloalkyl, or monocyclic or polycyclic $C_{3-20}$ heterocycloalkyl;

$L^2$ is a divalent linking;

$R^7$ to $R^8$ are each independently hydrogen, substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{6-20}$ aryl, or substituted or unsubstituted $C_{4-20}$ heteroaryl, $R^9$ is substituted or unsubstituted $C_{1-20}$ alkyl, substituted or unsubstituted $C_{3-20}$ cycloalkyl, or substituted or unsubstituted $C_{3-20}$ heterocycloalkyl, wherein one of $R^7$ or $R^8$ optionally forms a heterocyclic ring together with $R^9$;

$R^{10}$ to $R^{12}$ are each independently substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{6-20}$ aryl, or substituted or unsubstituted $C_{4-20}$ heteroaryl;

any two of $R^{10}$ to $R^{12}$ together optionally form a ring, and each of $R^{10}$ to $R^{12}$ optionally comprise as part of their structure one or more groups selected from —O—, —C(O)—, —N($R^{44}$)—, —S—, or —S(O)$_2$—, wherein $R^{44}$ is hydrogen, straight chain or branched $C_{1-20}$ alkyl, monocyclic or polycyclic $C_{3-20}$ cycloalkyl, or monocyclic or polycyclic $C_{3-20}$ heterocycloalkyl;

$X^a$ is a polymerizable group selected from norbornyl or vinyl;

n is 0 or 1; and $L^3$ is a single bond or a divalent linking group, provided that $L^3$ is not a single bond when $X^a$ is vinyl.

14. The method of claim 11, wherein the second repeating unit of the second polymer is derived from a monomer of formula (4), and the third repeating unit of the second polymer is derived from a monomer of formula (5):

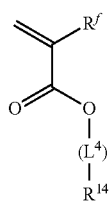
(4)

(5)

wherein, in Formulae (4) and (5), $R^f$ and $R^g$ are each independently hydrogen, fluorine, cyano, substituted or unsubstituted $C_{1-10}$ alkyl, or substituted or unsubstituted $C_{1-10}$ fluoroalkyl;

$L^4$ is a single bond or a divalent linking group;

$R^{44}$ is hydrogen, a straight chain or branched $C_{1-20}$ alkyl, monocyclic or polycyclic $C_{3-20}$ cycloalkyl, or monocyclic or polycyclic $C_{3-20}$ heterocycloalkyl;

$R^{14}$ is a monocyclic, polycyclic, or fused polycyclic $C_{4-20}$ lactone-containing group;

$Q^1$ is one or more of substituted or unsubstituted $C_{1-30}$ alkylene, substituted or unsubstituted $C_{3-30}$ cycloalkylene, substituted or unsubstituted $C_{1-30}$ heterocycloalkylene, substituted or unsubstituted $C_{6-30}$ arylene, substituted or unsubstituted divalent $C_{7-30}$ arylalkyl, substituted or unsubstituted $C_{1-30}$ heteroarylene, or substituted or unsubstituted divalent $C_{3-30}$ heteroarylalkyl, or —C(O)—O—;

W is the base-soluble group comprising —C(O)—OH; —C(CF$_3$)$_2$OH; an amide; an imide; or —NH—S(O)$_2$—Y$^1$ wherein Y$^1$ is F or $C_{1-4}$ perfluoroalkyl; and a is an integer of 1 to 3.

15. The method of claim 11, wherein the first polymer or the second polymer comprises a repeating unit comprising the photoacid generator.

16. The method of claim 15, further comprising a non-polymeric photoacid generator.

17. The method of claim 11, further comprising a photodecomposable quencher.

18. The method of claim 11, further comprising a base-labile material comprising one or more base-labile groups, wherein the base-labile material is different from the first polymer and the second polymer.

* * * * *